(12) United States Patent
Sutardja

(10) Patent No.: US 7,804,904 B1
(45) Date of Patent: *Sep. 28, 2010

(54) ACTIVE REPLICA TRANSFORMER HYBRID

(75) Inventor: Sehat Sutardja, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 1534 days.

This patent is subject to a terminal disclaimer.

(21) Appl. No.: 11/089,010

(22) Filed: Mar. 24, 2005

Related U.S. Application Data

(63) Continuation of application No. 09/737,743, filed on Dec. 18, 2000, now Pat. No. 7,194,037.

(60) Provisional application No. 60/206,409, filed on May 23, 2000, provisional application No. 60/211,571, filed on Jun. 15, 2000.

(51) Int. Cl.
*H04B 3/00* (2006.01)
*H04L 25/00* (2006.01)

(52) U.S. Cl. .................. 375/258; 375/257; 375/219; 375/220; 375/221; 375/350; 370/286; 379/406.1

(58) Field of Classification Search ......... 375/219–222, 375/257, 258, 285, 346, 350; 370/286, 289–291; 379/406.01–406.08
See application file for complete search history.

(56) References Cited

U.S. PATENT DOCUMENTS

| 3,297,951 | A |   | 1/1967  | Blasbalg         |
|-----------|---|---|---------|------------------|
| 3,500,215 | A |   | 3/1970  | Leuthold et al.  |
| 3,521,170 | A |   | 7/1970  | Leuthold et al.  |
| 3,543,009 | A |   | 11/1970 | Voelcher, Jr.    |
| 3,602,830 | A | * | 8/1971  | Hurd, III ............... 330/277 |
| 3,793,589 | A |   | 2/1974  | Puckette         |
| 3,973,089 | A |   | 8/1976  | Puckett          |
| 4,071,842 | A |   | 1/1978  | Tewksbury        |
| 4,087,654 | A | * | 5/1978  | Mueller ............... 379/406.08 |
| 4,112,253 | A |   | 9/1978  | Wilhelm          |
| 4,131,767 | A |   | 12/1978 | Weinstein        |
| 4,152,541 | A |   | 5/1979  | Yuen             |
| RE30,111  | E |   | 10/1979 | Blood, Jr.       |
| 4,309,673 | A |   | 1/1982  | Norberg et al.   |
| 4,321,753 | A |   | 3/1982  | Fusari           |

(Continued)

FOREIGN PATENT DOCUMENTS

DE    10 2004 017 497    11/2004

(Continued)

OTHER PUBLICATIONS

Kamran Azadet and Chris Nicole; Low Power Equalizer Architectures for High-Speed Modems; Oct. 1998; pp. 118-126.

(Continued)

*Primary Examiner*—Phuong Phu

(57) ABSTRACT

A communication circuit includes a near end transmitter, a hybrid having an input in communication with an output of the near end transmitter, and a near end adjustable load replication transmitter having an adjustable load. The communication circuit further includes a subtractor configured to subtract an output from the near end adjustable load replication transmitter from the output from the near end transmitter and the hybrid. The communication circuit further includes a near end receiver responsive to an output of the subtractor and a calibration circuit configured to adjust the adjustable load against a reference load.

30 Claims, 8 Drawing Sheets

U.S. PATENT DOCUMENTS

| | | | |
|---|---|---|---|
| 4,362,909 A | 12/1982 | Snijders et al. | |
| 4,393,370 A | 7/1983 | Hareyama | |
| 4,393,494 A | 7/1983 | Belforte et al. | |
| 4,408,190 A | 10/1983 | Nagano | |
| 4,464,545 A | 8/1984 | Werner | |
| 4,503,421 A | 3/1985 | Hareyama et al. | |
| 4,527,126 A | 7/1985 | Petrich et al. | |
| 4,535,206 A | 8/1985 | Falconer | |
| 4,591,832 A | 5/1986 | Fling et al. | |
| 4,605,826 A | 8/1986 | Kanemasa | |
| 4,621,172 A | 11/1986 | Kanemasa et al. | |
| 4,621,356 A | 11/1986 | Scipione | |
| 4,626,803 A | 12/1986 | Holm | |
| 4,715,064 A | 12/1987 | Claessen | |
| 4,727,566 A | 2/1988 | Dahlqvist | |
| 4,746,903 A | 5/1988 | Czarniak et al. | |
| 4,816,830 A | 3/1989 | Cooper | |
| 4,817,081 A | 3/1989 | Wouda et al. | |
| 4,868,571 A | 9/1989 | Inamasu | |
| 4,878,244 A | 10/1989 | Gawargy | |
| 4,888,762 A | 12/1989 | Arai | |
| 4,894,820 A | 1/1990 | Miyamoto | |
| 4,935,919 A | 6/1990 | Hiraguchi | |
| 4,947,171 A | 8/1990 | Pfeifer | |
| 4,970,715 A | 11/1990 | McMahan | |
| 4,972,360 A | 11/1990 | Cukier et al. | |
| 4,988,960 A | 1/1991 | Tomisawa | |
| 4,993,045 A | 2/1991 | Alfonso | |
| 4,999,830 A | 3/1991 | Agazzi | |
| 5,018,134 A | 5/1991 | Kokubo et al. | |
| 5,043,730 A | 8/1991 | Obinnata | |
| 5,084,865 A | 1/1992 | Koike | |
| 5,119,365 A | 6/1992 | Warner et al. | |
| 5,136,260 A | 8/1992 | Yousefi-Elezei | |
| 5,148,427 A | 9/1992 | Buttle et al. | |
| 5,153,450 A | 10/1992 | Ruetz | |
| 5,164,725 A | 11/1992 | Long | |
| 5,175,764 A | 12/1992 | Patel et al. | |
| 5,185,538 A | 2/1993 | Kondoh et al. | |
| 5,202,528 A | 4/1993 | Iwaooji | |
| 5,204,854 A * | 4/1993 | Gregorian et al. | 370/288 |
| 5,204,880 A | 4/1993 | Wurster et al. | |
| 5,212,659 A | 5/1993 | Scott et al. | |
| 5,222,084 A | 6/1993 | Takahashi | |
| 5,243,346 A | 9/1993 | Inami | |
| 5,243,347 A | 9/1993 | Jackson et al. | |
| 5,245,231 A | 9/1993 | Kocis et al. | |
| 5,245,654 A | 9/1993 | Wilkison et al. | |
| 5,248,956 A | 9/1993 | Himes | |
| 5,253,249 A | 10/1993 | Fitzgerald et al. | |
| 5,253,272 A | 10/1993 | Jaeger et al. | |
| 5,254,994 A | 10/1993 | Takakura et al. | |
| 5,267,269 A | 11/1993 | Shih et al. | |
| 5,269,313 A | 12/1993 | DePinto | |
| 5,272,453 A | 12/1993 | Traynor et al. | |
| 5,280,526 A | 1/1994 | Laturell | |
| 5,282,157 A | 1/1994 | Murphy et al. | |
| 5,283,582 A | 2/1994 | Krenik | |
| 5,305,379 A | 4/1994 | Takeuchi | |
| 5,307,064 A | 4/1994 | Kudoh | |
| 5,307,405 A | 4/1994 | Sih | |
| 5,323,157 A | 6/1994 | Ledzius et al. | |
| 5,325,400 A | 6/1994 | Co et al. | |
| 5,357,145 A | 10/1994 | Segaram | |
| 5,365,935 A | 11/1994 | Righter et al. | |
| 5,367,540 A | 11/1994 | Kakuishi et al. | |
| 5,375,147 A | 12/1994 | Awata et al. | |
| 5,388,092 A | 2/1995 | Koyama et al. | |
| 5,388,123 A | 2/1995 | Uesugi et al. | |
| 5,392,042 A | 2/1995 | Pellon | |
| 5,399,996 A | 3/1995 | Yates et al. | |
| 5,418,478 A | 5/1995 | Van Brunt et al. | |
| 5,440,514 A | 8/1995 | Flannagan et al. | |
| 5,440,515 A | 8/1995 | Chang et al. | |
| 5,444,739 A | 8/1995 | Uesegi et al. | |
| 5,465,272 A | 11/1995 | Smith | |
| 5,471,665 A | 11/1995 | Pace et al. | |
| 5,479,124 A | 12/1995 | Pun et al. | |
| 5,489,873 A | 2/1996 | Kamata et al. | |
| 5,507,036 A | 4/1996 | Vagher | |
| 5,508,656 A | 4/1996 | Jaffard et al. | |
| 5,517,141 A | 5/1996 | Abdi et al. | |
| 5,517,435 A | 5/1996 | Sugiyama | |
| 5,521,540 A | 5/1996 | Marbot | |
| 5,537,113 A | 7/1996 | Kawabata | |
| 5,539,403 A | 7/1996 | Tani et al. | |
| 5,539,405 A | 7/1996 | Norsworthy | |
| 5,539,773 A | 7/1996 | Knee et al. | |
| 5,559,476 A | 9/1996 | Zhang et al. | |
| 5,568,064 A | 10/1996 | Beers et al. | |
| 5,568,142 A | 10/1996 | Velazquez et al. | |
| 5,572,158 A | 11/1996 | Lee et al. | |
| 5,572,159 A | 11/1996 | McFarland | |
| 5,577,027 A | 11/1996 | Cheng | |
| 5,579,004 A | 11/1996 | Linz | |
| 5,585,795 A | 12/1996 | Yuasa et al. | |
| 5,585,802 A | 12/1996 | Cabler et al. | |
| 5,587,681 A | 12/1996 | Fobbester | |
| 5,589,788 A | 12/1996 | Goto | |
| 5,596,439 A | 1/1997 | Dankberg et al. | |
| 5,600,321 A | 2/1997 | Winen | |
| 5,613,233 A | 3/1997 | Vagher | |
| 5,625,357 A | 4/1997 | Cabler | |
| 5,629,652 A | 5/1997 | Weiss | |
| 5,648,738 A | 7/1997 | Welland et al. | |
| 5,651,029 A | 7/1997 | Yang | |
| 5,659,609 A | 8/1997 | Koizumi et al. | |
| 5,663,728 A | 9/1997 | Essenwanger | |
| 5,666,354 A | 9/1997 | Cecchi et al. | |
| 5,684,482 A | 11/1997 | Galton | |
| 5,687,330 A | 11/1997 | Gist et al. | |
| 5,696,796 A | 12/1997 | Poklemba | |
| 5,703,541 A | 12/1997 | Nakashima | |
| 5,719,515 A | 2/1998 | Danger | |
| 5,726,583 A | 3/1998 | Kaplinsky | |
| 5,745,564 A | 4/1998 | Meek | |
| 5,757,219 A | 5/1998 | Weedon et al. | |
| 5,757,298 A | 5/1998 | Manley et al. | |
| 5,760,726 A | 6/1998 | Koifman et al. | |
| 5,790,060 A | 8/1998 | Tesche | |
| 5,796,725 A | 8/1998 | Muraoka | |
| 5,798,661 A | 8/1998 | Runaldue et al. | |
| 5,798,664 A | 8/1998 | Nagahori et al. | |
| 5,812,597 A | 9/1998 | Graham et al. | |
| 5,821,892 A | 10/1998 | Smith | |
| 5,822,426 A | 10/1998 | Rasmus et al. | |
| 5,825,819 A | 10/1998 | Cogburn | |
| 5,834,860 A | 11/1998 | Parsons et al. | |
| 5,838,177 A | 11/1998 | Keeth | |
| 5,838,186 A | 11/1998 | Inoue et al. | |
| 5,841,386 A | 11/1998 | Leduc | |
| 5,841,809 A | 11/1998 | Koizumi et al. | |
| 5,844,439 A | 12/1998 | Zortea | |
| 5,859,552 A | 1/1999 | Do et al. | |
| 5,864,587 A | 1/1999 | Hunt | |
| 5,880,615 A | 3/1999 | Bazes | |
| 5,887,059 A | 3/1999 | Xie et al. | |
| 5,894,496 A | 4/1999 | Jones | |
| 5,898,340 A | 4/1999 | Chatterjee et al. | |
| 5,930,686 A | 7/1999 | Devline et al. | |
| 5,936,450 A | 8/1999 | Unger | |
| 5,940,442 A | 8/1999 | Wong et al. | |
| 5,940,498 A | 8/1999 | Bardl | |
| 5,949,362 A | 9/1999 | Tesche et al. | |

| | | | |
|---|---|---|---|
| 5,963,069 A | 10/1999 | Jefferson et al. | |
| 5,982,317 A | 11/1999 | Steensgaard-Madsen | |
| 5,999,044 A | 12/1999 | Wohlfarth et al. | |
| 6,005,370 A | 12/1999 | Gustavson | |
| 6,014,048 A | 1/2000 | Talaga et al. | |
| 6,037,812 A | 3/2000 | Gaudet | |
| 6,038,266 A | 3/2000 | Lee et al. | |
| 6,043,766 A | 3/2000 | Hee et al. | |
| 6,044,489 A | 3/2000 | Hee et al. | |
| 6,046,607 A | 4/2000 | Kohdaka | |
| 6,047,346 A | 4/2000 | Lau et al. | |
| 6,049,706 A | 4/2000 | Cook et al. | |
| 6,052,076 A | 4/2000 | Patton, III et al. | |
| 6,057,716 A | 5/2000 | Dinteman et al. | |
| 6,067,327 A | 5/2000 | Creigh et al. | |
| 6,087,968 A | 7/2000 | Roza | |
| 6,094,082 A | 7/2000 | Gaudet | |
| 6,100,830 A | 8/2000 | Dedic | |
| 6,121,831 A | 9/2000 | Mack | |
| 6,137,328 A | 10/2000 | Sung | |
| 6,140,857 A | 10/2000 | Bazes | |
| 6,148,025 A | 11/2000 | Shirani et al. | |
| 6,150,856 A | 11/2000 | Morzano | |
| 6,154,784 A | 11/2000 | Liu | |
| 6,163,283 A | 12/2000 | Schofield | |
| 6,163,289 A | 12/2000 | Ginetti | |
| 6,163,579 A | 12/2000 | Harrington et al. | |
| 6,166,572 A | 12/2000 | Yamoaka | |
| 6,172,634 B1 | 1/2001 | Leonowich et al. | |
| 6,173,019 B1 | 1/2001 | Hee et al. | |
| 6,177,896 B1 | 1/2001 | Min | |
| 6,185,263 B1 | 2/2001 | Chan | |
| 6,188,282 B1 | 2/2001 | Montalvo | |
| 6,191,719 B1 | 2/2001 | Bult et al. | |
| 6,192,226 B1 | 2/2001 | Fang | |
| 6,201,490 B1 | 3/2001 | Kawano et al. | |
| 6,201,831 B1 | 3/2001 | Agazzi et al. | |
| 6,201,841 B1 | 3/2001 | Iwamatsu et al. | |
| 6,204,788 B1 | 3/2001 | Tani | |
| 6,211,716 B1 | 4/2001 | Nguyen et al. | |
| 6,215,429 B1 | 4/2001 | Fischer et al. | |
| 6,223,061 B1 | 4/2001 | Dacus et al. | |
| 6,236,345 B1 | 5/2001 | Dagnachew et al. | |
| 6,236,346 B1 | 5/2001 | Schofield | |
| 6,236,645 B1 | 5/2001 | Agazzi | |
| 6,249,164 B1 | 6/2001 | Cranford, Jr. et al. | |
| 6,249,249 B1 | 6/2001 | Obayashi et al. | |
| 6,259,680 B1 | 7/2001 | Blackwell et al. | |
| 6,259,745 B1 | 7/2001 | Chan | |
| 6,259,957 B1 | 7/2001 | Alexander et al. | |
| 6,266,367 B1 | 7/2001 | Strait | |
| 6,271,782 B1 | 8/2001 | Steensgaard-Madsen | |
| 6,275,098 B1 | 8/2001 | Uehara et al. | |
| 6,288,604 B1 | 9/2001 | Shih et al. | |
| 6,289,068 B1 | 9/2001 | Hassoun et al. | |
| 6,295,012 B1 | 9/2001 | Greig | |
| 6,298,046 B1 | 10/2001 | Thiele | |
| 6,307,490 B1 | 10/2001 | Litfin et al. | |
| 6,309,077 B1 | 10/2001 | Saif et al. | |
| 6,313,775 B1 | 11/2001 | Lindfors et al. | |
| 6,332,004 B1 | 12/2001 | Chang | |
| 6,333,959 B1 | 12/2001 | Lai et al. | |
| 6,339,390 B1 | 1/2002 | Velazquez et al. | |
| 6,340,940 B1 | 1/2002 | Melanson | |
| 6,346,899 B1 * | 2/2002 | Hadidi | 341/144 |
| 6,351,229 B1 | 2/2002 | Wang | |
| RE37,619 E | 4/2002 | Mercer et al. | |
| 6,369,734 B2 | 4/2002 | Volk | |
| 6,370,190 B1 | 4/2002 | Young et al. | |
| 6,373,417 B1 | 4/2002 | Melanson | |
| 6,373,908 B2 | 4/2002 | Chan | |
| 6,377,640 B2 | 4/2002 | Trans | |
| 6,377,683 B1 | 4/2002 | Dobson et al. | |
| 6,385,238 B1 | 5/2002 | Nguyen et al. | |
| 6,385,442 B1 | 5/2002 | Vu et al. | |
| 6,389,077 B1 | 5/2002 | Chan | |
| 6,408,032 B1 | 6/2002 | Lye et al. | |
| 6,411,647 B1 | 6/2002 | Chan | |
| 6,415,003 B1 | 7/2002 | Raghavan | |
| 6,421,377 B1 | 7/2002 | Langberg et al. | |
| 6,421,534 B1 | 7/2002 | Cook et al. | |
| 6,433,608 B1 | 8/2002 | Huang | |
| 6,441,761 B1 | 8/2002 | Viswanathan | |
| 6,452,428 B1 | 9/2002 | Mooney et al. | |
| 6,462,688 B1 | 10/2002 | Sutardja | |
| 6,476,746 B2 | 11/2002 | Viswanathan | |
| 6,476,749 B1 | 11/2002 | Yeap et al. | |
| 6,477,200 B1 | 11/2002 | Agazzi et al. | |
| 6,492,922 B1 | 12/2002 | New | |
| 6,501,402 B2 | 12/2002 | Boxho | |
| 6,509,854 B1 | 1/2003 | Morita et al. | |
| 6,509,857 B1 | 1/2003 | Nakao | |
| 6,531,973 B2 | 3/2003 | Brooks et al. | |
| 6,535,987 B1 | 3/2003 | Ferrant | |
| 6,539,072 B1 | 3/2003 | Donnelly et al. | |
| 6,556,677 B1 | 4/2003 | Hardy | |
| 6,563,870 B1 | 5/2003 | Schenk | |
| 6,570,931 B1 | 5/2003 | Song | |
| 6,576,746 B2 | 6/2003 | McBride et al. | |
| 6,577,114 B1 | 6/2003 | Roo | |
| 6,583,742 B1 | 6/2003 | Hossack | |
| 6,594,304 B2 | 7/2003 | Chan | |
| 6,608,743 B1 | 8/2003 | Suzuki | |
| 6,633,178 B2 | 10/2003 | Wilcox et al. | |
| 6,687,286 B1 | 2/2004 | Leonowich et al. | |
| 6,690,742 B2 | 2/2004 | Chan | |
| 6,714,825 B1 | 3/2004 | Tanaka | |
| 6,721,379 B1 | 4/2004 | Cranford, Jr. et al. | |
| 6,731,748 B1 | 5/2004 | Edgar et al. | |
| 6,744,831 B2 * | 6/2004 | Chan | 375/346 |
| 6,744,931 B2 | 6/2004 | Komiya et al. | |
| 6,751,202 B1 | 6/2004 | Henrie | |
| 6,775,529 B1 | 8/2004 | Roo | |
| 6,816,097 B2 | 11/2004 | Brooks et al. | |
| 6,823,028 B1 | 11/2004 | Phanse | |
| 6,844,837 B1 | 1/2005 | Sutardja | |
| 6,864,726 B2 | 3/2005 | Levin et al. | |
| 6,882,216 B2 | 4/2005 | Kang | |
| 7,095,348 B1 * | 8/2006 | Sutardja et al. | 341/144 |
| 7,113,121 B1 * | 9/2006 | Sutardja et al. | 341/144 |
| 7,194,037 B1 * | 3/2007 | Sutardja | 375/258 |
| 7,280,060 B1 * | 10/2007 | Sutardja et al. | 341/144 |
| 7,312,739 B1 * | 12/2007 | Sutardja et al. | 341/144 |
| 2001/0050585 A1 | 12/2001 | Carr | |
| 2002/0009057 A1 | 1/2002 | Blackwell et al. | |
| 2002/0061087 A1 | 5/2002 | Williams | |
| 2002/0084857 A1 | 7/2002 | Kim | |
| 2002/0136321 A1 | 9/2002 | Chan | |
| 2002/0181601 A1 | 12/2002 | Huang et al. | |
| 2003/0002570 A1 | 1/2003 | Chan | |
| 2003/0174660 A1 | 9/2003 | Blon et al. | |
| 2004/0005015 A1 | 1/2004 | Chan | |
| 2004/0090981 A1 | 5/2004 | Lin et al. | |
| 2004/0091071 A1 | 5/2004 | Lin et al. | |
| 2004/0105504 A1 | 6/2004 | Chan | |
| 2004/0141569 A1 | 7/2004 | Agazzi | |
| 2004/0208312 A1 | 10/2004 | Okuda | |
| 2005/0025266 A1 | 2/2005 | Chan | |

FOREIGN PATENT DOCUMENTS

| | | |
|---|---|---|
| EP | 0 800 278 | 8/1997 |
| JP | 57-48827 | 3/1982 |
| JP | 58-111415 | 7/1983 |
| JP | 62-159925 | 7/1987 |
| JP | 63-300700 | 7/1988 |

| | | |
|---|---|---|
| JP | 63-300700 | 12/1988 |
| JP | 204527 | 8/1989 |
| JP | 3-273704 | 12/1991 |
| JP | 4-293306 | 10/1992 |
| JP | 4-351109 | 12/1992 |
| JP | 05-064231 A | 3/1993 |
| JP | 06-029853 | 2/1994 |
| JP | 06-97831 | 4/1994 |
| JP | 6-276182 | 9/1994 |
| JP | 7-131260 | 5/1995 |
| JP | 09-55770 | 8/1995 |
| JP | 09-270707 | 3/1996 |
| JP | 10-126183 | 5/1998 |
| JP | 2001-177409 | 12/1999 |
| JP | 06-97831 | 4/2005 |
| JP | 09-270707 | 4/2005 |
| JP | 2001-177409 | 4/2005 |
| TW | 0497334 | 8/2002 |
| TW | 0512608 | 12/2002 |
| TW | 0545016 | 8/2003 |
| WO | WO 99/46867 | 9/1999 |
| WO | WO 00/27079 | 5/2000 |
| WO | WO 00/28663 | 5/2000 |
| WO | WO 00/28663 A2 | 5/2000 |
| WO | WO 00/28663 A3 | 5/2000 |
| WO | WO 00/28668 | 5/2000 |
| WO | WO 00/28691 | 5/2000 |
| WO | WO 00/28691 A2 | 5/2000 |
| WO | WO 00/28691 A3 | 5/2000 |
| WO | WO 00/28712 | 5/2000 |
| WO | WO 00/35094 | 6/2000 |

OTHER PUBLICATIONS

Liberali et al., "Progress in High-Speed and High -Resolution CMOS Data Converters", Sep. 12-14, 1995, pp. 19-28.
Sedra et al., "Micro-Electronic Circuits", 1982, pp. 95-97 and 243-247.
DP83220 CDL™ Twisted Pair FDDI Transceiver Device, Oct. 1992.
Su et al., "A CMOS Oversampling D/A Converter with a Current-Mode Semidigital Reconstruction Filter", Dec. 1993, pp. 1224-1233.
Miki et al., "An 80-MHz 8-bit CMOS D/A Converter", Dec. 1986, pp. 983-988.
Letham et al, "A high-performance CMOS 70-Mhzpalette/DAC", Dec. 1987, pp. 1041-1047.
Nakamura et al., "A 10-b 70-MS/s CMOS D/A/ converter", Apr. 1991, pp. 637-642.
Takakura et al., "A10 bit 80 MHz glitchless CMOS D/A/ converter", May 1991, pp. 26.5.1-26.5.4.
Fournier et al., "A 130-MHz 8-b CMOS video DAC for HDTV applications", Jul. 1991, pp. 1073-1077.
Reynolds, "A 320 MHz CMOS triple 8b DAC with on-chip PLL and hardware cursor", Feb. 1994, pp. 50-51.
Chin et al., "A 10-b 125 MHz CMOS digital-to-analog (DAC) with threshold-voltage compensated current sources", Nov. 1994, pp. 1374-1380.
Wu et al., A low glitch 10-bit 75-MHz CMOS video D/A converter, Jan. 1995, pp. 68-72.
Gray et al., Analysis and Design of Analog Integrated Circuits, 1997.
Sedra et al., Microelectronic Circuits, Third Edition, 1991, pp. 48-115.
Lee, et al., "A CMOS Serial Link for Fully Duplexed Data Communication", Apr. 1995.
Shoval et al., "WA 18.7—A Combined 10/125 Mbaud Twisted-Pair Line Driver with Programmable Performance/Power Features," 2000, pp. 314-315.
Song, et al., FP 12.1: NRZ Timing Recovery Technique for Band-Limited Channels (Slide Supplement), 1996.
Chien, "Monolithic CMOS Frequency Synthesizer for Cellular Applications", Mar. 12-13.
Chien, "Delay Based Monolithic CMOS Frequency Synthesizer for Portable Wireless Applications", May 20, 1998.
Chien, "Low-Noise Local Oscillator Design Techniques using DLL-based Frequency Multiplier for Wireless Applications", 2000.
Cho et al.; "A Single-Chip CMOS Direct Conversion Transceiver for 900 MHz Spread-Spectrum Digital Cordless Telephones"; 1999.
Shoval et al.; "A CMOS Mixed-Signal 100Mb/s Receive Architecture for Fast Ethernet"; 1999.
Hester et al.; "CODEC for Echo-Canceling Full-Rate ADSL Modems"; Dec. 1999.
Nack, et al., "A Constant Slew Rate Ethernet Line Driver", May 2001.
Song, "Dual Mode Transmitter with Adaptively Controlled Slew Rate and Impedance Supporting Wide Range Data Rates", 2001.
Yee et al., An Integratable 1-2.5 Gbps Low Jitter CMOS Transceiver with Built in Self Test Capability, 1999.
Intersil, HC-5509B ITU CO/Loop Carrier SLIC, Aug. 2003.
Regan, ADSL Line Driver/Receiver Design Guide, Part 1, Feb. 2000.
Phillps, The HC-5502X14X Telephone Subscriber Line Interface Circuits (SLIC), Jan. 1997.
Fuad Surial Atiya, et al., An Operational Amplifier Circulator Based on the Weighted Summer, Jun. 1975.
Narayanan et al., Doppler Estimation Using a Coherent Ultrawide-Band Random Noise Radar, Jun. 2000.
Stephens, Active Output Impedance for ADLS Line Drivers, Nov. 2002.
Azadet et al., A Gigabit Transceiver Chip Set for UTP CA-6 Cables in Digital CMOS Technology, Feb. 2000.
He et al., A DSP Receiver for 1000 Base-T PHY, 2001.
Baird et al., A Mixed Sample 120M s PRML Solution for DVD Systems, 1999.
Baker, An Adaptive Cable Equalizer for Serial Digital Rates to 400Mb/s, 1996.
Everitt et al., A 10/100Mb/s CMOS Ethernet Transceiver for 10BaseT, 10BaseTX and 100Base FX, 1998.
Roo et al., A CMOS Transceiver Analog Front-end for Gigabit Ethernet over Cat-5 Cables, 2001.
Shoaei et al., A 3V Low Power 0.25um CMOS 100Mb/s Receiver for Fast Ethernet, 2000.
Walker et al., A Two Chip 1.5 GBd Serial Link Interface, Dec. 1992.
Lee, et al., A 3V 10b 100 MS/s Digital-to-Analog Converter for Cable Modem Applications, Aug. 28-30, 2000 pp. 203-205.
Rudell, et al., "SA 18.3: A 1.9 GHz Wide-band IF Double Conversion CMOS Integrated Receiver for Cordless Telephone Applications," 1997, pp. 304-305, 476.
Young, et al., Monolithic High-Performance three-Dimensional Coil Inductors for Wireless Communications, 1997.
Wu, et al., A low glitch 10-bit 75 MHz CMOS video D/A converter, Jan. 1995, pp. 68-72.
Johns, et al., "Integrated Circuits for Data Transmission Over Twisted Pair Channels", Mar. 1997, pp. 398-406.
"IEEE Standard 802.3: Part 3 Carrier Sense Multiple Access with Collision Detection (CSMA/CD) Access Method and Physical Detection", Mar. 8, 2002, pp. 1-1538.
Young, et al., "A Low-Noise RF Voltage-Controlled Oscillator Using On-Chip High-Q Three-Dimensional Coil Inductor and Micromachined Variable Capacitor", Jun. 8-11, 1998, pp. 128-131.
Young, et al., "A Micromachined Variable Capacitor for Monolithic Low-Noise VCOS", 1996, pp. 86-89.
Abidi, et al., "FA 7.2: The Future of CMOS Wireless Transceivers", Feb. 7, 1997, pp. 118-119, 440.
Eto, et al., "A 333 MHz, 20mW, 18ps Resolution Digital DLL using Current-controlled Delay with Parallel Variables Resistor DAC (PVR-DAC)", Aug. 28-30, 2000, pp. 349-350.
Ivan Jorgensen, et al., "Design of a 10-bit 100 MSamples/s BiCMOS D/A Converter", 1996, pp. 730-733.
Henriques, et al., "A CMOS Steering-Current Multiplying Digital-to-Analog Converter", 1995, pp. 145-155.
Wikner, et al., "Modeling of CMOS Digital-to-Analog Converters for Telecommunication", May 1999, pp. 489-499.
Van der Plas, et al., "A 14-Bit Intrinsic Accuracy $Q^2$ Random Walk CMOS DAC", Dec. 1999, pp. 1708-1718.
Radke, et al., "A 14-Bit Current-Mode $\Sigma\Delta$ DAC Based Upon Rotated Data Weighted Averaging", Aug. 2000, pp. 1074-1084.
Shui, et al., "Mismatch Shaping for a Current-Mode Multibit Delta-Sigma DAC", Mar. 1999, pp. 331-338.

Hamasaki, et al., "A 3-V, 22-mV Multibit Current-Mode ΣΔ DAC with 100 dB Dynamic Range", Dec. 1996, pp. 1888-1894.
Tsutomu Kamoto, "An 8-bit 2-ns Monolithic DAC", Feb. 1988.
Weaver, Jr., "A Third Method of Generation and Detection of Single-Sideband Signals," Dec. 1956, pp. 1703-1705.
Niknejad et al., "Analysis and Optimization of Monolithic Inductors and Transformers for RF ICs," 1997, pp. 375-378.
Niknejad et al., "Analysis, Design, and Optimization of Spiral Inductors and Transformers for Si RF IC's," Oct. 1998, pp. 1470-1481.
American National Standard, "Fibre Distributed Data Interface (FDDI)—Token Ring Twisted Pair Layer Medium Dependent (TP-PMD)," Sep. 25, 1995.
Nguyen et al., "Si IC-Compatible Inductors and LC Passive Filters," Aug. 1990, pp. 1028-1031.
Gardner, "Charge-Pump Phase-Lock Loops," Nov. 1980, pp. 1849-1858.
Davies, "Digital Generation of Low-Frequency Sine Waves," Jun. 1969, pp. 97-105.
Abidi, "TP 11.1: Direct-Conversion Radio Transceivers for Digital Communications," 1995.
Dolle, "A Dynamic Line-Termination Circuit for Multireceiver Nets," Dec. 1993, pp. 1370-1373.
Su et al., "Experimental Results and Modeling Techniques for Substrate Noise in Mixed-Signal Integrated Circuits," Apr. 1993, pp. 420-430.
Gray et al., "Future Directions in Silicon ICs for RF Personal Communications," 1995, pp. 83-90.
Gabara, "On-Chip Terminating Registers for High Speed ECL-CMOS Interfaces," 1992, pp. 292-295.
Horowitz et al., "High-Speed Electrical Signaling: Overview and Limitations," 1998, pp. 12-24.
Efendovich et al., Multifrequency Zero-Jitter Delay-Locked Loop, Jan. 1994, 67-70.
Niknejad et al., Numerically Stable Green Function for Modeling and Analysis of Substrate Coupling in Integrated Circuits, Apr. 1998, 305-315.
Hajimiri et al., Phase Noise in Multi-Gigahertz CMOS Ring Oscillators, 1998, 49-52.
Kim et al., "A 30-MHz Hybrid Analog/Digital Clock Recovery Circuit in 2-µm CMOS," 1990, pp. 1385-1394.
Liu et al., "WP 23.7: A 6.5 GHz Monolithic CMOS Voltage-Controlled Oscillator," 1999, pp. 404-405, 484.
Wang et al., "WP 23.8: A 9.8 GHz Back-Gate Tuned VCO in 0.35 µm CMOS," 1999, pp. 406-407, 484.
Rofougaran et al., "SP 24.6: A 900 MHz CMOS LC-Oscillator with Quadrature Outputs," 1996.
Koullias et al., "TP 9.2: A 900 MHz Transceiver Chip Set for Dual-Mode Cellular Radio Mobile Terminals," 1993, pp. 140-141, 278.
Dauphinee et al., "SP 23.7: A Balanced 1.5 GHz Voltage Controlled Oscillator with an Integrated LC Resonator," 1997, pp. 390-391, 491.
Banu et al., "A BiCMOS Double-Low-IF Receiver for GSM," 1997, pp. 521-524.
Chang et al., "A CMOS Channel-Select Filter for a Direct-Conversion Wireless Receiver," 1996, pp. 62-63.
Waizman, "FA 18.5: A Delay Line Loop for Frequency Synthesis of De-Skewed Clock," Feb. 18, 1994, pp. 298-299.
Kinget, "FP 14.7: A Fully Integrated 2.7V 0.35 µm CMOS VCO for 5 GHz Wireless Applications," Feb. 5, 1998.
Lee et al., "A Fully Integrated Low-Noise 1-GHz Frequency Synthesizer Design for Mobile Communication Application," May 1997, pp. 760-765.
Parker et al., "A Low-Noise 1.6-GHz CMOS PLL with On-Chip Loop Filter," 1997, pp. 407, 409-410.
Park et al., "A Low-Noise, 900-MHz VCO in 0.6 µm CMOS," May 1999, pp. 586-591.
Soyuer et al., "A Monolithic 2.3-Gb/s 100-mW Clock and Data Recovery Circuit in Silicon Bipolar Technology," Dec. 1993, pp. 1310-1313.
Hu et al., "A Monolithic 480 Mb/s Parallel AGC/Decision/Clock-Recovery Circuit in 1.2-µm CMOS," Dec. 1993, pp. 1314-1320.
Parameswaran et al., "A New Approach for the Fabrication of Micromechanical Structures," Dec. 6, 1998, pp. 289-307.

Knight, Jr. et al., A Self-Terminating Low-Voltage Swing CMOS Output Driver, 1988, 457-464.
Maneatis, Low-Jitter Process-Independent DLL and PLL Based on Self-Biased Techniques, Nov. 1996, 1723-1732.
Chang et al., Large Suspended Inductors on Silicon and Their Use in a 1-um CMOS RF Amplifier, May 1993, 246-248.
Gharpurey et al., Modeling and Analysis of Substrate Coupling in Integrated Cicuits, Mar. 1996, 344-353.
Myson Technology, "MTD214—Ethernet Encoder/Decoder and 10BaseT Transceiver with Built-in Waveform Shaper," 1997, pp. 1-11.
Myson Technology, "MTD972 (Preliminary) 100BaseTX PCS/PMA," 1997, pp. 1-21.
Craninckx et al., "A 1.8-GHz Low-Phase-Noise CMOS VCO Using Optimized Hollow Spiral Inductors," 1997, pp. 736-744.
Craninckx et al., "A 1.8-GHz Low-Phase-Noise Voltage-Controlled Oscillator with Prescaler," 1995, pp. 1474-1482.
Hung et al., "A 1.24-GHz Monolithic CMOS VCO with Phase Noise of 137 dBc/Hz at a 3-MHz Offset," 1999, pp. 111-113.
Rudell et al., "A 1.9-GHz Wide-Band IF Double Conversion CMOS Receiver for Cordless Telephone Applications," 1997, pp. 2071-2088.
Lin et al., "TP 12.5: A 1.4 GHz Differential Low-Noise CMOS Frequency Synthesizer using a Wideband PLL Architecture," 2000, pp. 204-205, 458.
Razavi, "SP 23.6: A 1.8 GHz CMOS Voltage-Controlled Oscillator," 1997, pp. 388-389.
Dec et al., "MP 4.8: A 1.9 GHz Micromachine-Based Low-Phase-Noise CMOS VCO," 1999, pp. 80-81, 449.
Sato et al., "SP 21.2: A 1.9 GHz Single-Chip IF Transceiver for Digital Cordless Phones," Feb. 10, 1996.
Lee et al., "A 2.5 V CMOS Delay-Locked Loop for an 18 Mbit, 500 Megabytes/s DRAM," 1994, pp. 1491-1496.
Joo Leong Tham, et al., "A 2.7-V 900-MHz/1.9-GHz Dual-Band Transceiver IC for Digital Wireless Communication," 1999, pp. 286-291.
Lam et al., "WP 23.6: A 2.6 GHz/5.2 GHz CMOS Voltage-Controlled Oscillator," 1999, pp. 402-403, 484.
Marshall et al., "TA 8.7: A 2.7V GSM Transceiver ICs with On-Chip Filtering," 1995.
Rudell et al., Recent Developments in High Integration Multi-Standard CMOS Transceivers for Personal Communication Systems, 1998, 149-154.
Shoval et al., A 100 Mb/s BiCMOS Adaptive Pulse-Shaping Filter, Dec. 1995, 1692-1702.
Jansen et al., SP 23.8: Silicon Bipolar VCO Family for 1.1 to 2.2 GHz with Fully-Integrated Tank and Tuning Circuits, Feb. 8, 1997, 392-393 & 492.
Chan, et al., A 100 Mb/s CMOS 100Base-T3 Fast Ethernet Transceiver for Category 3, 4, & 5 UTP, 1998.
Wang, et al., A 1.2 GHz programmable DLL-Based Frequency Multiplier for Wireless Applications, Dec. 2004.
Sedra, et al., Microelectronic Circuits, 3rd Edition, 1991.
U.S. Appl. No. 09/920,240, filed Aug. 1, 2001, Roo.
U.S. Appl. No. 09/920,241, filed Aug. 1, 2001, Sutardja.
Dunning, Jim, "An All-Digital Phase-Locked Loop with 50-Cycle Lock Time Suitable for High-Performance Microprocessors," IEEE Journal of Solid-State Circuits, vol. 30, No. 4, Apr. 1995, pp. 412-422.
Moon, Yongsam, et al., "An All-Analog Multiphase Delay-Locked Loop Using a Replica Delay Line for Wide-Range Operation and Low-Jitter Performance," IEEE Journal of Solid-State Circuits, vol. 35, No. 3, Mar. 2000, pp. 377-384.
Wang, HongMo, "WP 23.8: A 9.8GHz Back-Gate Tuned VCO in 0.35 µm CMOS," ISSCC99, Session 23, Paper WP 23.8, 1999 IEEE International Solid-State Circuits Conference, pp. 406-407 & 484.
Rudell, et al., "SA 18.3: A 1.9 GHz Wide-Bank IF Double Conversion CMOS Integrated Receiver for Cordless Telephone Applications," 1997, pp. 304-305, 476.
"Gigabit Ethernet 1000Base-T," Gigabit Ethernet Alliance, copyright 1997.
The Electrical Engineering Handbook, Chapter 31, "D/A and A/D Converters," Richard C. Dorf, editor, CRC Press, 1993.

Sedra, et al. "Operational Amplifiers," Microelectronic Circuits, Chapter 2, Section 2.4, 3rd Edition, 1991, pp. 61-63.

H4000 Digital Ethernet Transceiver Technical Manual, Distributed Systems, Chapter 3, pp. 3-1 to 3-11, copyright 1982 by Digital Equipment Corporation.

IEEE Standards 802.3ab-2002, "Part 3: Carrier sense multiple access with collision detection (CSMA/CD) access method and physical layer specifications", pp. 147-249.

Stephens, "Active Output Impedance for ASDL Line Drivers", Nov. 2002.

Wang, et al., "A 1.2 GHz Programmable DLL-Based Frequency Multiplier for Wireless Applications", Dec. 2004.

Harald, et al., "Design of a 10-bit 100 MSamples/s BiCMOS D/A Converter", 1996, pp. 730-733.

Lee, et al., "A 3V 10b 100MS/s Digital-To-Analog Converter for Cable Modem Applications", Aug. 28-30, 2000, pp. 203-205.

Cho et al., "TP 13.5: A Single-Chip CMOS Direct-Conversion Transceiver for 900 MHz Spread-Spectrum Digital Cordless Phones," 1999, pp. 228-229, 464.

Sedra et al., Microelectronic Circuits, Third Edition, 1991, pp. 86-92.

Moon et al., "An All Analog Multiphase Delay Locked Loop Using a Replica Delay Line for Wide Range Operation and Low-Jitter Performance," Mar. 2000, pp. 377-384.

I.E.E.E. Standard 802.3: Part 3, "Carrier Sense Multiple Access with Collision Detection (CSMA/CD) Access Method and Physical Detection," Mar. 8, 2002, pp. 1-378.

Rudell et al., "SA 18.3: A 1.9 GHz Wide-band IF Double Conversion CMOS Integrated Receiver for Cordless Telephone Applications," 1997, pp. 304-305, 476.

Leong et al., "A 2.7-V 900-MHz/1.9-GHz Dual-Band Transceiver IC for Digital Wireless Communication," 1999, pp. 286-291.

Sedra et al., Microelectronic Circuits, 3rd ed., 1991.

Fuad et al., An Operational Amplifier Circulator Based on the Weighted Summer, Jun. 1975.

Everitt et al., A CMOS Transceiver for 10-Mb/s and 100-Mb/s Ethernet, Dec. 1998.

Chan et al., A 100 Mb/s CMOS 100Base-T4 Fast Ethernet Transceiver for Category 3, 4 & 5 UTP, 1998.

Kelly et al., A Mixed Signal DFE/Ffe Receiver for 100BaseTX Applications, 2000.

Mueller, Combining Echo Cancellation and Decision Feedback Equalization, Feb. 29, 1979.

Shoval, A Combined 10/125 Mbaud Twisted Pair Line Driver with Programmable Performance/Power Features, 2000.

Shoval et al., A 100 Mb/s BiCMOS Adaptive Pulse-Shaping Filter, Dec. 1995, 1692-1702.

Jansen et al., SP 23.8: Silicon Bipolar VCO Family for 1.1 to 2.2 GHz with Fully-Integrated Tank and Tuning Circuits, Feb. 8, 1997, 392-393 & 492.

Falconer; "Echo Cancellation in Two Wire Full Duplex With Estimation of Far-End Data Components"; Aug. 13, 1985.

Gawargy; "Electronic Hybrid Circuit"; Oct. 31, 1989.

U.S. Appl. No. 60/106,265, filed Oct. 30, 1998, Chan.
U.S. Appl. No. 60/107,105, filed Nov. 4, 1998, Chan.
U.S. Appl. No. 60/107,702, filed Nov. 9, 1998, Chan.
U.S. Appl. No. 60/108,001, filed Nov. 11, 1998, Chan.
U.S. Appl. No. 60/106,265, filed Oct. 30, 1998, Chan.

Bertolaccini, Mario, et al., A Precision Baseline Offset and Drift Corrector for Low-Frequency Applications, IEEE Transactions on Instrumentation and Measurement, vol. IM-34, No. 3, Sep. 1985, pp. 405-412.

Everitt, James, et al., "A CMOS Transceiver for 10-Mb/s and 100-Mb/s Ethernet," IEEE Journal of Solid-State Circuits, vol. 33, No. 12, Dec. 1998, pp. 2169-2177.

Kelly, N. Patrick, et al., "WA 18.5—A Mixed-Signal DFE/FFE Receiver for 100Base-TX Applications," ISSCC 2000/Session 18/Wireline Communications/Paper WA 18.5, 2000 IEEE International Sold-State Circuits Conference, pp. 310-311.

Song, Bang-Sup, et al., "FP 12.1: NRZ Timing Recovery Technique for Band-Limited Channels," ISSCC 96/Session 12/Serial Data Communications/Paper FP 12.1, 1996 IEEE International Solid State Circuits Conference pp. 194-196.

Goldberg, Lee, "Gigabit Ethernet PHY Chip Sets LAN Speed Record for CopperStory," TECH Insights, Nov. 16, 1998.

Mueller, K.H., "Combining Echo Cancellation and Decision Feedback Equalization," The Bell System Technical Journal, vol. 58, No. 2, Feb. 1979, pp. 491-500.

Chien, "Monolithic CMOS Frequency Synthesizer for Cellular Appliations"; Mar. 12-13, 1997.

Chien, et al., "TP 12.4: A 900-MHz Local Oscillator using a DLL-based Frequency Multiplier Technique for PCS Applications"; Feb. 8, 2000.

Dally, et al., "Digital Systems Engineering"; 1998; cover and pp. 390-391.

Dally, et al., "High Performance Electrical Signaling"; Jun. 1998.

Dehng, et al., "A Fast Lock Mixed Mode DLL Using a s-B SAR Algorithm"; Oct. 2001.

Dehng, et al., "Clock-Deskaw Buffer Using a SAR-Controlled Delay-Locked Loop"; Aug. 2000.

Farjad-rad, et al., "4.5 A 0.2-2GHz 12mW Multiplying DLL for Low-Jitter Clock Synthesis in Highly Integrated Data Communication Chip"; 2002.

Fink et al., "Electronics Engineers' Hanbook," published by McGraw-Hill, Inc. 1982, pp. 12-31 to 12-32.

Garlepp, et al., "A Portable Digital DLL Architecture for CMOS Interface Circuits"; Jun. 1998.

Goldberg, Gigabit Ethernet PHY Chip Sets LAN Speed Record for Copper Story; Nov. 16, 1998; 6 pages.

Gotoh, et al., "All-Digital Multi-Phase Delay Locked Loop for Internal Timing Generation in Embedded and/or high-Speed DRAMS"; Jun. 1997.

Gray, et al. "Analysis and Design of Analog Integrated Circuit", Fourth Edition; Mar. 2001, pp. 217-221.

Hellums et al., "An ADSI Integrated Active Hybrid Circuit"; Sep. 2003.

Hellwarth, et al., "Digital to analog converter having Common-mode Isolation and Differential Output"; Jul. 1972.

High Speed Modem Solutions Info Card 20; 1998.

Johnson, et al., "THAM 11.2: A Variable Delay Line Phase Locked Loop for CPU-Coprocessor Synchronization"; Feb. 1998.

Kim et al., "PLL/DLL System Noise Analysis for Low Jitter Clock Synthesizer Design"; Jun. 1994; p. 31-34.

Kim, et al., "A Low-Power Small-Area 7.28-ps-Jitter-1-GHz DLL Based Clock Generator"; Nov. 2002.

Lin, et al. "A Register-Controller Symmetrical DLL for Double-Data-Rate DRAM"; Apr. 1999.

Lin, et al., "A 10-b, 500-Msample/s CMOS DAC in 0.6mm2"; Dec. 1998.

Linear Technology, High Speed Modem Solutions Info Card; 1997.

Linear Technology, High Speed Moden Solutions, InfoCard 20; Linear Technology Corp.; 1997.

Linear Technology, LT1355/LT1356, Dual and Quad 12 MHz, 400V/µs Op Amps; Linear Technology Corp.; pp. 1-16; 1997.

Linear Technology, LT1358/LT1359, Dual and Quad 25 MHz, 600V/µs Op Amps; Linear Technology Corp.; pp. 1-12; 1997.

Linear Technology, LT1361/LT1362, Dual and Quad 50 MHz, 800V/µs Op Amps; Linear Technology Corp.; pp. 1-12; 1997.

Linear Technology, LT1364/LT1365, Dual and Quad 70MHz, 1000V/µs Op Amps; Linear Technology Corp.; pp. 1-12; 1997.

Linear Technology, LT1813/LT1814, Dual/Quad 3mA, 100 MHz, 750V µs Operational Amplifiers, Linear Technology Corp.; pp. 1-16; 1997.

Maneatis, John G., "FA 8.1: Low-Jitter and Process-Independent DLL and PLL Based on Self-Biased Techniques"; Feb. 1996.

Mano, "Digital Logic and Computer Design"; 1979.

Millman, et al., "Pulse, Digital, and Switching Waveforms"; 1965; pp. 674-675.

Munshi, et al. "Adaptive Impedance Matching"; Jun. 1994.

Razavi, "Principles of Data Conversion System Design"; Dec. 1994.

Sailesh Rao; Short Course: Local Area Networks, International Solid State Circuits Conference; Sailesh Rao; Outline implementing Gigabit Ethernet Over Cat-5 Twisted-Pair Cabling; Jack Kenny; Signal Processing and Detection in Gigabit Ethernet; 1999; 3 pages.

Senntag, et al., "FAM: 11.5: A Monolithic CMOS 10MHz DPLL for Burse-Mode"; 1990.

Techdictionary.com definition of decoder, Link: http://www.techdictionary.com; As of Jul. 17, 2008; 1 page.

The Authoritative Dictionary of IEEE Standards Stems 7th Edition; Dec. 2000; p. 280.

Uda, et al., "125Mbit/s Fiber Optic Transmitter/Receiver with Duplex Connector"; Fiber Optic Communications Development Div., NEC Corp., NEC Engineering, Ltd., With English Language Translation; 1988.

University of Pennsylvania CSE Digital Logic Lab re decoders. Link: http://www.cse,dmu.ac.uk/~sexton/WWW/Pages/cs2.html; As of Jul. 17, 2008; 3 pages.

Van de Plassche, Integrated Analog-to-Digital and Digital-to-Analog Converters; 1994; Chapter 6, pp. 211-271.

Weigandt, et al., "Analysis of Timing Jitters in CMOS Ring Oscillators." 1994; pp. 27-30.

Yamaguchi, et al.; "400 Mbit/s Submarine Optical Repeater Using Integrated Circuits"; GUJITSU Laboratories Ltd. With Engllish Language Translation; 1988.

* cited by examiner

ACTIVE REPLICA TRANSFORMER HYBRID

CROSS REFERENCE TO RELATED APPLICATIONS

This application is a divisional of U.S. application Ser. No. 09/737,743, filed Dec. 18, 2000, which claims priority under 35 U.S.C. §119(e) to U.S. Provisional Application Ser. No. 60/206,409, entitled "Active Replica Transformer Hybrid," filed May 23, 2000, and to U.S. Provisional Application Ser. No. 60/211,571, entitled "Active Replica Transformer Hybrid," filed Jun. 15, 2000, the entire contents of each of which are incorporated by reference herein.

This application is related to the following commonly-assigned application: "Direct Drive Programmable High Speed Power Digital-to-Analog Converter," filed Dec. 18, 2000, and assigned U.S. application Ser. No. 09/737,474 (now U.S. Pat. No. 6,462,688), the entire contents of which are incorporated by reference herein.

BACKGROUND

1. Field of the Invention

This invention relates to an active replication transmitter circuit for near end transmission cancellation and more specifically to an adjustable replication transmitter circuit with a low pass filter.

2. Background Information

Hybrids are widely used in communication systems that send and receive signals on a single pair of wires. In order to detect the signals with error free performance, it is important that near end transmission from the nearby-transmitted signal be removed from the received signal. A good hybrid is defined as a hybrid that can reject most of the near end transmission signal from the desired received signal. A good hybrid is important, because as the distance between two ends of a communicating/network nodes increases, the received signal strength decreases, while near end transmission signal from the nearby transmitted signal stays approximately constant. In order to detect the received signal with error free performance, it is important that any near end transmission signal from the nearby transmitted signal is removed from the received signal.

In many conventional communications systems, such as PC modems, ADSL, VDSL and the like, operating on standard twisted pair telephone wires, the two ends of the communicating nodes are isolated by one or more isolation transformers. There are two types of conventional hybrids typically used in such applications. The first is a bridge hybrid, also referred to as a resistive bridge hybrid. The second type is a hybrid transformer. For these types of applications, these hybrids generally work well, because these applications do not usually utilize the low frequency range of the communications bandwidth. Another term for this is DC free signaling.

Newer communication systems, such as gigabit Ethernet (I.E.E.E. standard 802.3ab), use a non-DC free signaling. Unfortunately, conventional hybrids only work well for rejecting higher frequency near end transmission signals. Therefore, extremely complicated digital signal processing (DSP) based echo canceling technology is needed to reject not only the residual high frequency echo but also the large amplitude low frequency echo signal. This low frequency echo signal is seen by the receiver as transmitter base line wander.

U.S. Pat. No. 4,935,919 to Hiraguchi is directed to an echo canceler in a modem, which cancels echoes from hybrid transformers on both the near end and the far end. The echo canceler has a variable delay, which may be adjusted to conform to a round trip of an echo. An adaptive filter has a number of delay circuits, each adding an increment of delay. A number of these delay circuits are selected in order to provide a selected delay time.

U.S. Pat. No. 5,305,379 to Takeuchi, et al. describes a sending data buffer for holding sending data temporarily and transmitting the data to an echo canceler section. The data buffer is installed between a sending section and an echo canceler that is included in a subscriber line circuit of an integrated service digital network. The sending data buffer is operated in a shift register mode during a sending training mode, and operated in FIFO (first in-first out) mode during a sending/receiving training mode.

FIG. 1 shows a block diagram of a communication system showing a near end transmitter 12(NET), near end receiver 14 (NER), in communication with a near end hybrid 10. A wire link 16, usually a twisted wire pair, connects the near end hybrid to a far end hybrid 11 which is in communication with a far end receiver 15 (FER) and a far end transmitter 13 (FET). Desired transmission is from the near end transmitter 12 to the far end receiver 15 and from the far end transmitter 13 to the near end receiver 14. It is important to reject or attenuate near end transmission signals from the near end transmitter 12 to the near end receiver 14.

FIG. 2A shows a diagram of the near end of such a communication system having cross talk attenuation. In this arrangement, NET 12 is configured as a current source. Current generated by the current source flows through output resistor R and develops a voltage across output resistor R. Alternatively, as shown in FIG. 2B, NET 12' may be configured as a voltage source having resistors R1 and R2. In either arrangement, NET 12 (12') feeds the primary of an isolation transformer 20. The secondary of the isolation transformer 20 is connected to a twisted wire pair communication link 22, which will be connected to a far end circuit, not shown. A replication transmitter 18 is provided to attempt to eliminate near end transmission signals from transmitter 12 (12'). The output of replication transmitter 18 is subtracted from the primary of the isolation transformer 20 by subtraction circuit 24. The output of subtraction circuit 24 is provided as an input to NER 14. Thus, the input NER 14 comprises the received signal and the transmitted signal less the replication signal. In order to eliminate effectively the effects of NET 12, the voltage developed at the output of NET 12 (I×R) should be equal to the voltage developed by replication transmitter 18 or I×$R_{replication}$. In other words, $R_{replication}$ should be equal to R. However, due to process variations, it is difficult to ensure that $R_{replication}$ is equal to R. As a result, such a conventional arrangement does not sufficiently eliminate the effects from NET 12 (12').

SUMMARY OF THE INVENTION

This invention solves these problems by using a circuit with an adjustable replication transmitter and a high pass filter to provide cross talk attenuation over a wide frequency range. The adjustable replication transmitter is adjusted so that the amplitude of the voltages at the replication transmitter provides the best possible cross talk attenuation. The high pass filter compensates for the reduced load seen by the near end transmitter at very low frequencies in order to provide effective cross talk attenuation to very low frequencies. The adjustable replication transmitter and the high pass filter can be used separately or together.

According to a first aspect of the present invention, a communication circuit comprises a near end transmitter, a hybrid having an input in communication with an output of the near end transmitter, a near end replication transmitter, a high pass filter responsive to the near end replication transmitter, a subtractor to subtract an output from the high pass filter from the output from the near end transmitter and an output of the hybrid, and a near end receiver responsive to an output of the subtractor.

According to a second aspect of the present invention, the hybrid comprises an isolation transformer.

According to a third aspect of the present invention, the hybrid comprises an active circuit.

According to a fourth aspect of the present invention, the near end replication transmitter is adjustable.

According to a fifth aspect of the present invention, the near end replication transmitter comprises a current generator connected in parallel with an adjustable load.

According to a sixth aspect of the present invention, the near end replication transmitter comprises an adjustable current generator connected in parallel with a load.

According to a seventh aspect of the present invention, an adjustable capacitive load is provided in communication with the near end replication transmitter to maximize signal delay matching between the near end transmitter and the near end replication transmitter.

According to an eighth aspect of the present invention, an adaptive control circuit is provided and is responsive to the adaptive control circuit.

According to a ninth aspect of the present invention, the high pass filter comprises an inductor having similar characteristics as the hybrid.

According to a tenth aspect of the present invention, the high pass filter comprises a combination of a resistance and a capacitance.

According to an eleventh aspect of the present invention, a communication circuit comprises a near end transmitter, a hybrid having an input in communication with an output of the near end transmitter, a near end adjustable replication transmitter, a subtractor to subtract an output from the near end adjustable replication transmitter from the output from the near end transmitter and the hybrid, and a near end receiver responsive to an output of the subtractor.

According to a twelfth aspect of the present invention, a communication circuit comprises near end transmitting means for transmitting a transmitted signal, hybrid means having an input in communication with an output of the near end transmitting means for communicating the transmitted signal to and a received signal from a channel, near end replication transmitting means for generating a replication signal, high pass filter means for high pass filtering the replication signal, subtracting means for the high pass filtered replication signal from the transmitted and received signals, and near end receiving means for receiving an output signal from the subtracting means.

According to a thirteenth aspect of the present invention, a communication circuit comprises near end transmitting means for transmitting a transmitted signal, hybrid means having an input in communication with an output of the near end transmitting means for communicating the transmitted signal to and a received signal from a channel, near end adjustable replication transmitting means for generating an adjustable replication signal, subtracting means for subtracting the adjustable replication signal from the received signal and the transmitted signal, and near end receiving means for receiving an output of the subtracting means.

According to a fourteenth aspect of the present invention, a communication method comprises the steps of (a) transmitting a transmitted signal, (b) combining the transmitted signal with a received signal from a channel, (c) generating a replication signal, (d) high pass filtering the replication signal, (e) subtracting the high pass filtered replication signal from the transmitted and received signals, and (f) receiving an output signal from step (e).

According to a fifteenth aspect of the present invention, a communication method comprises the steps of (a) transmitting a transmitted signal, (b) combining the transmitted signal with a received signal from a channel, (c) generating a replication signal, (d) adjusting the replication signal, (e) subtracting adjusted replication signal from the transmitted and received signals, and (f) receiving an output signal from step (e).

According to a sixteenth aspect of the present invention, a communication circuit comprises a near end circuit and a far end circuit. The near end circuit comprises a near end transmitter, a near end hybrid having a first terminal in communication with an output of the near end transmitter and a second terminal, a near end replication transmitter, a near end high pass filter responsive to the near end replication transmitter, a near end subtractor to subtract an output from the near end high pass filter from the output from the near end transmitter and the near end hybrid, and a near end receiver responsive to an output of the near end subtractor. The far end circuit comprises a far end transmitter, a far end hybrid having a third terminal in communication with an output of the far end transmitter and a fourth terminal in communication with the second terminal of the near end hybrid, a far end replication transmitter, a far end high pass filter responsive to the far end replication transmitter, a far end subtractor to subtract an output from the far end high pass filter from the output from the far end transmitter and the far end hybrid, and a far end receiver responsive to an output of the far end subtractor.

According to a seventeenth aspect of the present invention, a communication circuit comprises a near end circuit and a far end circuit. The near end circuit comprises a near end transmitter, a near end hybrid having a first terminal in communication with an output of the near end transmitter and a second terminal, a near end adjustable replication transmitter, a near end subtractor to subtract an output from the near end adjustable replication transmitter from the output from the near end transmitter and the near end hybrid, and a near end receiver responsive to an output of the near end subtractor. The far end circuit comprises a far end transmitter, a far end hybrid having a third terminal in communication with an output of the far end transmitter and fourth terminal in communication with the second terminal of the near end hybrid, a far end adjustable replication transmitter, a far end subtractor to subtract an output from the far end adjustable replication transmitter from the output from the far end transmitter and the far end hybrid, and a far end receiver responsive to an output of the far end subtractor.

According to an eighteenth aspect of the present invention, a communication circuit comprises a near end communication means and a far end communication means. The near end communication means comprises near end transmitting means for transmitting a first signal, near end hybrid means having a first terminal in communication with an output of the near end transmitting means for communicating the first signal to and in communication with a second signal from a channel, near end replication transmitting means for transmitting a near end replication signal, near end high pass filter means for high pass filtering the near end replication signal, near end subtracting means for subtracting the near end high pass filtered replication signal from the first signal from the near end transmitting means and the second signal from the near end hybrid means, and near end receiving means for receiving an output signal from the near end subtracting means. The far end communication means comprises far end transmitting means for transmitting the second signal, far end hybrid means having a second terminal in communication with an output of the far end transmitting means for communicating the second signal to and the first signal from the channel, far end replication transmitting means for generating a far end replication signal, far end high pass filter means for high pass filtering the far end replication signal, subtracting means for the far end high pass filtered replication signal from the second signal from the far end transmitting means and the first signal from the far end hybrid means, and far end receiving means for receiving an output signal from the subtracting means.

According to a nineteenth aspect of the present invention, a communication circuit comprises a near end communication means and a far end communication means. The near end communication means comprises near end transmitting means for transmitting a first signal, near end hybrid means having an input in communication with an output of the near end transmitting means for communicating the first signal to and a second signal from a channel, near end adjustable replication transmitting means for generating a near end adjustable replication signal, near end subtracting means for subtracting the near end adjustable replication signal from the first signal from the near end transmitting means and the second signal from the near end hybrid means, and near end receiving means for receiving an output of the near end subtracting means. The far end communication means comprises far end transmitting means for transmitting the second signal, far end hybrid means having an input in communication with an output of the far end transmitting means for communicating the second signal to and the first signal from the channel, far end adjustable replication transmitting means for generating a far end adjustable replication signal, far end subtracting means for subtracting the far end adjustable replication signal from the second signal from the far end transmitting means and the first signal from the far end hybrid means, and far end receiving means for receiving an output of the far end subtracting means.

According to a twentieth aspect of the present invention, a communication method comprises the steps of (a) transmitting a first signal, (b) combining the first signal with a second signal from a channel, (c) generating a first replication signal, (d) high pass filtering the first replication signal, (e) subtracting the high pass filtered first replication signal from the first and second signals, receiving an output signal from step (e), (g) transmitting the second signal, (h) combining the second signal with the first signal from the channel, (i) generating a second replication signal, (j) high pass filtering the second replication signal, (k) subtracting the high pass filtered second replication signal from the first and second signals, and receiving an output signal from step (k).

According to a twenty-first aspect of the present invention, a communication method comprises the steps of (a) transmitting a first signal, (b) combining the first signal with a second signal from a channel, (c) generating a first replication signal, (d) adjusting the first replication signal, (e) subtracting the adjusted first replication signal from the first and second signals, receiving an output signal from step (e), (g) transmitting the second signal, (h) combining the second signal with the first signal from the channel, (i) generating a second replication signal, (j) adjusting the second replication signal, (k) subtracting the adjusted second replication signal from the first and second signals, and (l) receiving an output signal from step (k).

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

Refer now to FIGS. 3A-16 for a description of the preferred embodiments of this invention.

Figure 1:
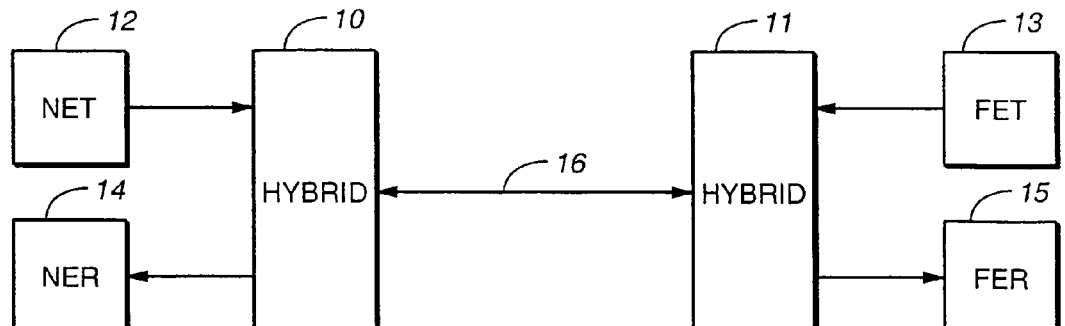
FIG. 1 is a block diagram of a conventional communication system.
Figure 2A:
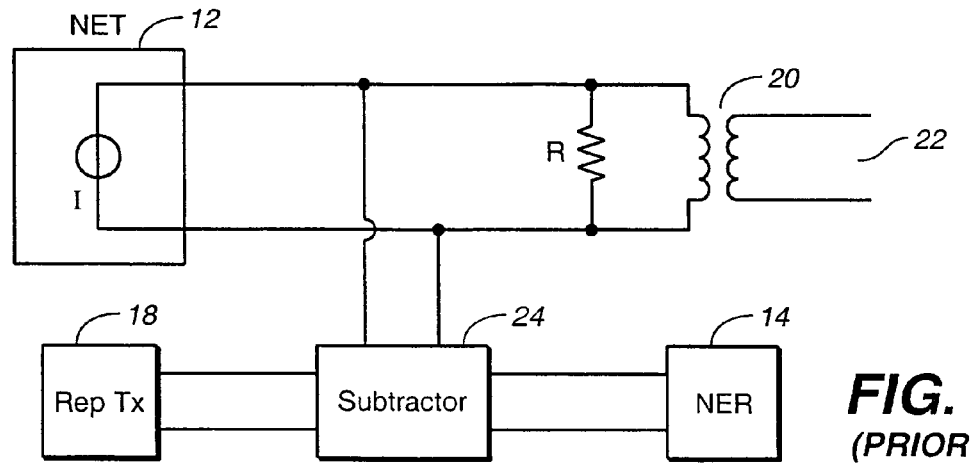
FIGS. 2A and 2B are schematic diagrams of conventional communication systems having NET noise attenuation.
Figure 2B:
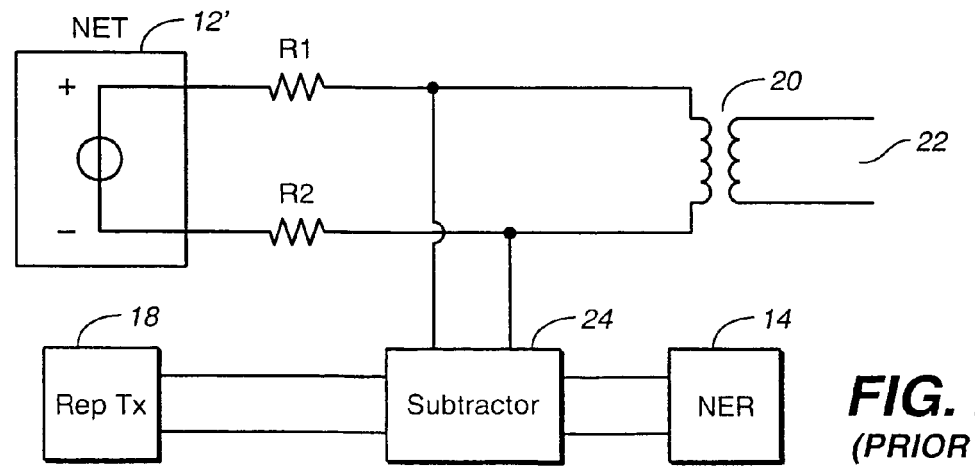
Figure 3A:
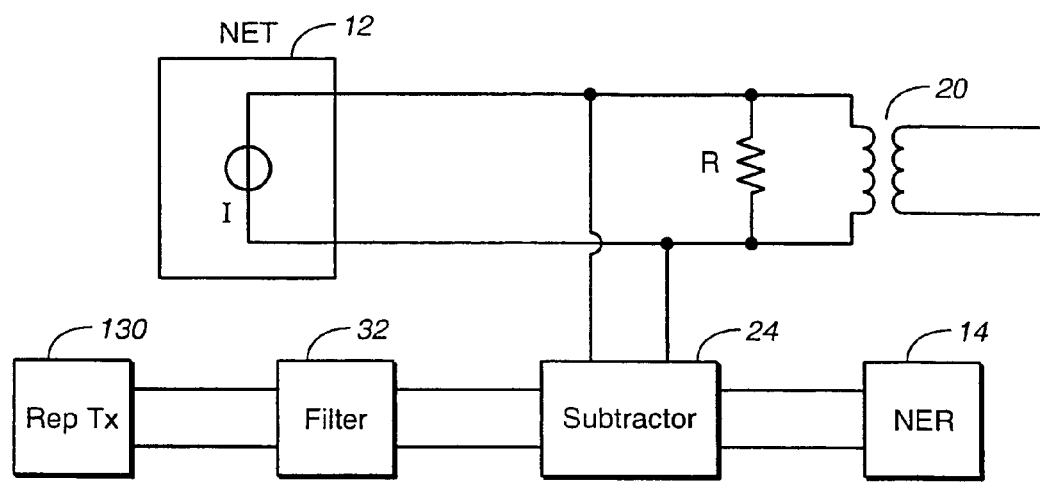
FIGS. 3A and 3B are schematic diagrams of the communication system of the first embodiment of the present invention having NET attenuation provided by a replication transmitter and a low pass filter arranged between the replication transmitter and the subtraction circuit.
Figure 3B:
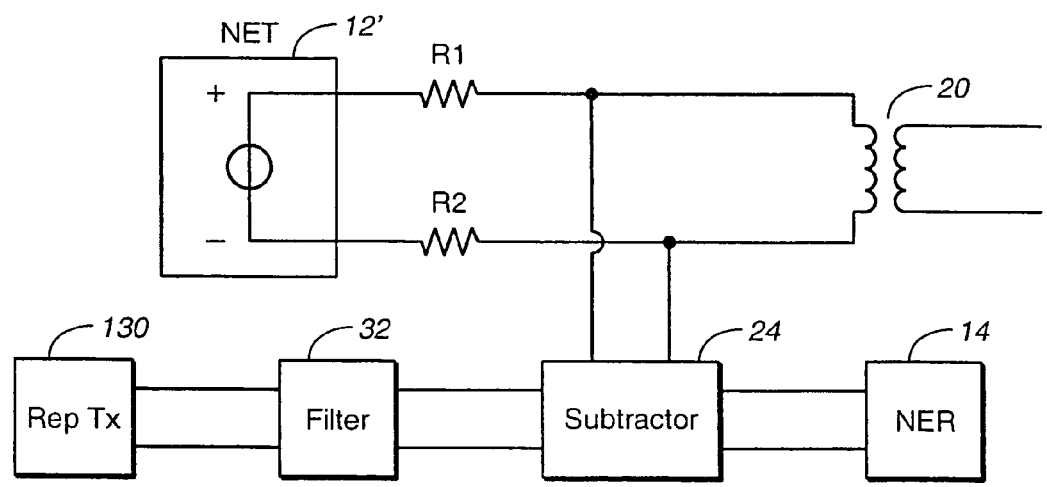

A first embodiment of the communication system of this invention is shown in FIGS. 3A and 3B. The present invention is preferably implemented in an Ethernet transceiver operating at 1000 Mbits/sec. As shown therein, near end transmitter 12 feeds the primary of an isolation transformer 20. The secondary of the isolation transformer 20 is connected to a twisted wire pair 22, which is connected to a far end circuit, not shown. The primary of the isolation transformer 20 is also fed to subtraction circuit 24, and an output of subtraction circuit 24 is input to near end receiver 14. In this embodiment, a replication transmitter 130 is provided to compensate for the effects of near end transmitter 12 as another input to subtraction circuit 24. A high pass filter 32 is further provided between replication transmitter 30 and subtraction circuit 24. The high pass filter compensates for the decreased load seen by the near end transmitter 12 at lower frequencies.

Figure 6:
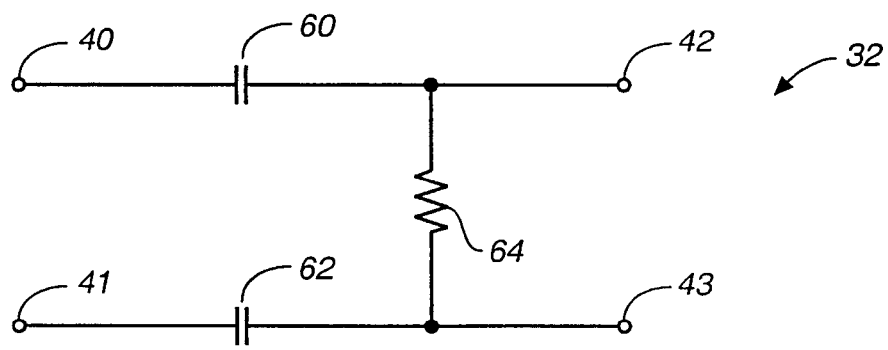
FIG. 6 is a schematic diagram of an example of a high pass filter.
Figure 7:
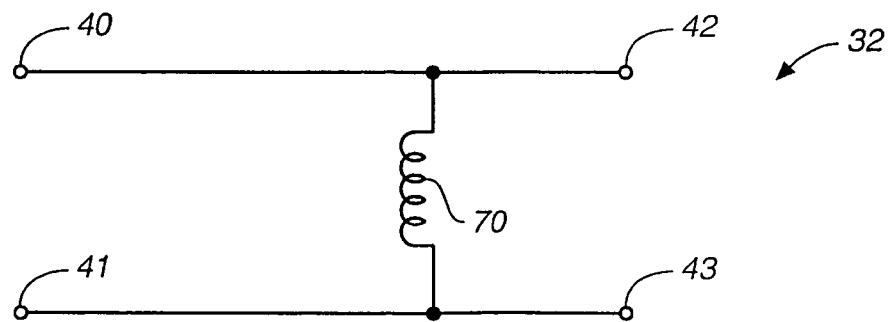
FIG. 7 is a schematic diagram of another example of a high pass filter.

FIGS. 6 and 7 show two circuits for realizing the high pass filter 32. The circuit of FIG. 6 shows an RC network having a first capacitor 60 connected between the first input 40 and first output 42, a second capacitor 62 connected between the second input 41 and second output 43, and a resistor 64 connected between the first output 42 and the second output 43. The filter of FIG. 6 reduces the amount of the voltages from the replication transmitter 130 reaching the subtraction network at lower frequencies.

The circuit of FIG. 7 illustrates a high pass filter implemented as an inductor 70. The inductor 70 places a load which decreases at decreasing frequencies between the first output and second output of the replication transmitter which reduces the amount of the voltages from the replication transmitter reaching the subtraction network at lower frequencies. The circuit of FIG. 7 has the added advantage that the inductor 70 can be chosen to match the inductance of the primary of the isolation transformer seen by the outputs of the near end transmitter. The inductor will simulate the DC wander behavior of NET 12. Alternatively, inductor 70 can be implemented by isolation transformer having the same characteristics of isolation transformer 20. However, this implementation is somewhat more costly than the matching inductor.

In such an arrangement, any DC components of the transmit signal exists in the replica path signal. By using this replica, a much simpler digital signal processor (DSP) based echo canceler may be employed to cancel any residual echo that is not cancelled.

Figure 4A:
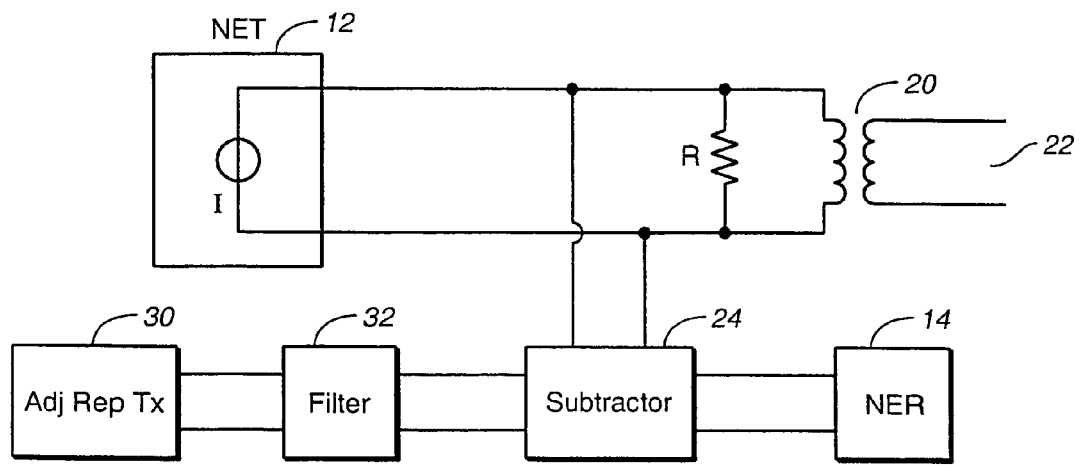
FIGS. 4A and 4B are schematic diagrams of the communication system of the second embodiment of the present invention having NET attenuation provided by an adjustable replication transmitter and a low pass filter arranged between the replication transmitter and the subtraction circuit.
Figure 4B:
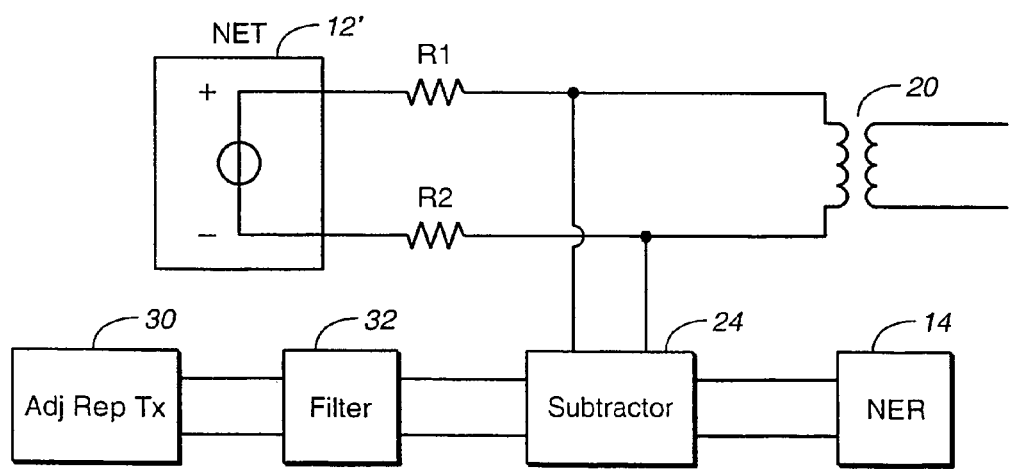

A second embodiment of the communication method of this invention is shown in FIGS. 4A and 4B. The second embodiment is similar to the first embodiment and replication transmitter 30 comprises an adjustable gain control to maximize the amplitude matching between the main signal path and the replica signal path.

Figure 11A:
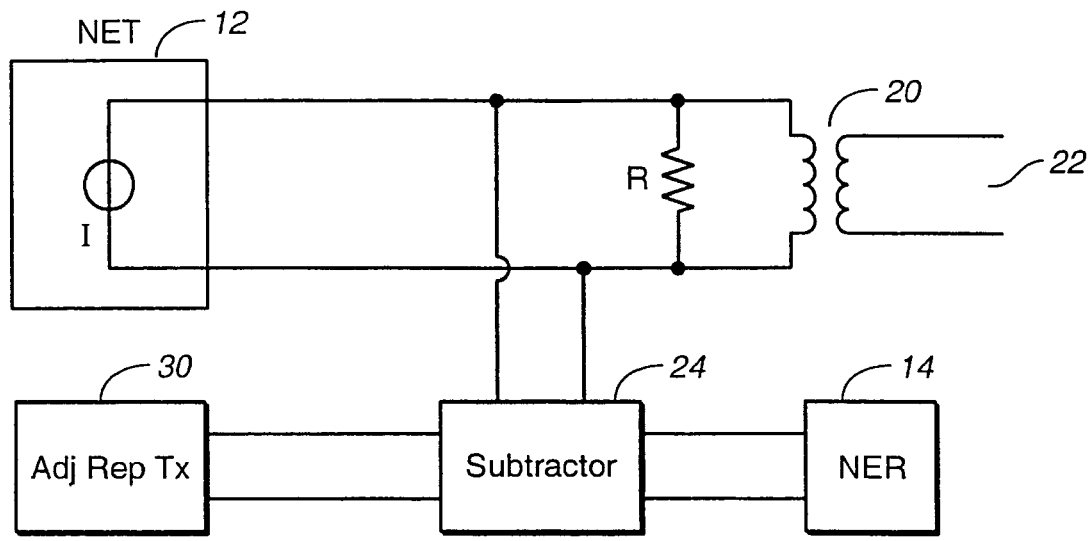
FIGS. 11A and 11B are schematic diagrams of the communication system of a third embodiment of the present invention having NET noise attenuation provided by an adjustable replication transmitter.
Figure 11B:
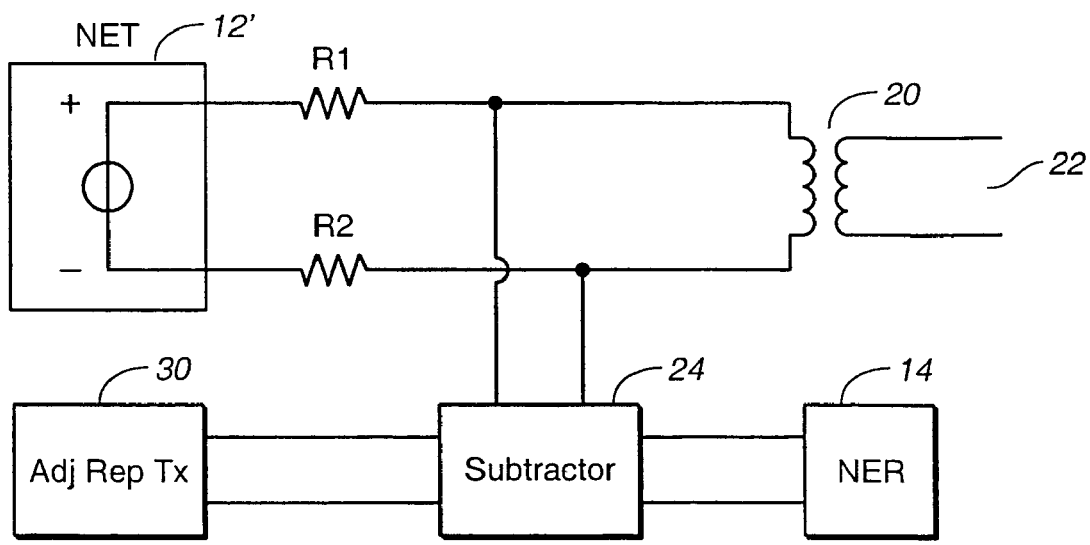

FIGS. 11A and 11B illustrate a third embodiment which is similar to the second embodiment, except that the high pass filter is omitted. In some implementations, the near end transmitter 12 may generate a near end signal by generating a plurality of near end currents and summing the plurality of near end currents.

Figure 5:
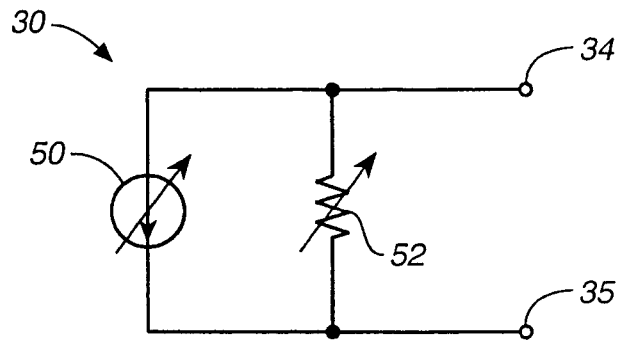
FIG. 5 is a schematic diagram of an example of an adjustable transmitter.

A circuit which can be used to realize adjustable replication transmitter 30 is shown in FIG. 5. The replication transmitter comprises a current source 50, connected in parallel with a load 52. Either current source 50, load or resistor 52, or both can be varied to produce the adjustable voltages at the output thereof.

Figure 8:
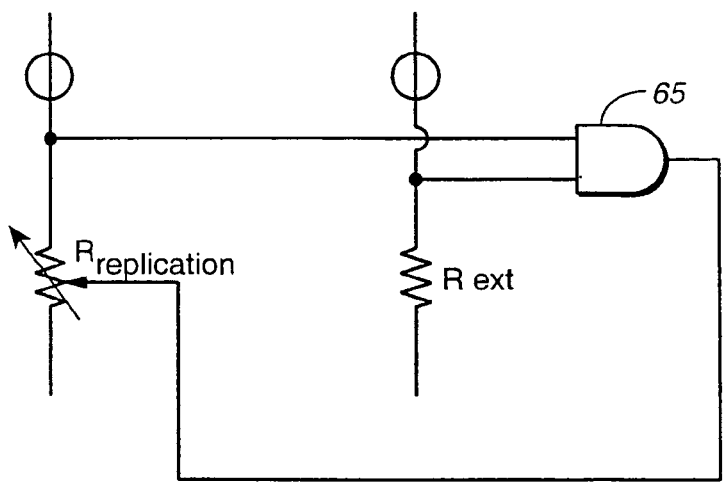
FIG. 8 is a schematic diagram of an example of a calibration circuit in accordance with the present invention.
Figure 9:
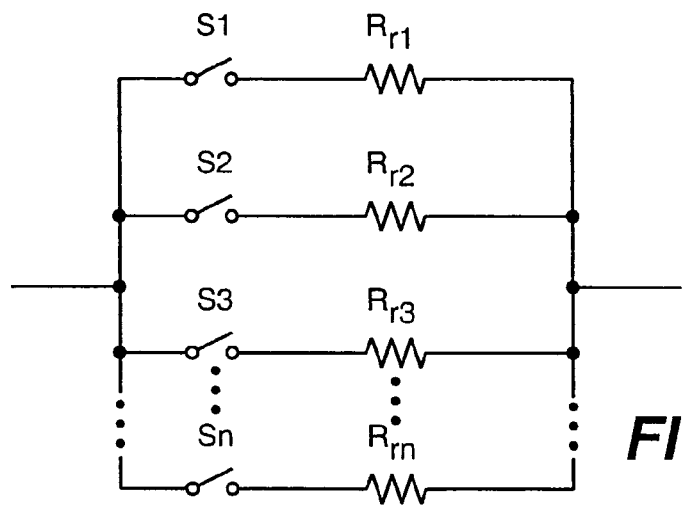
FIG. 9 is a schematic of an example of a variable resistance used in the calibration circuit of FIG. 8.
Figure 10:
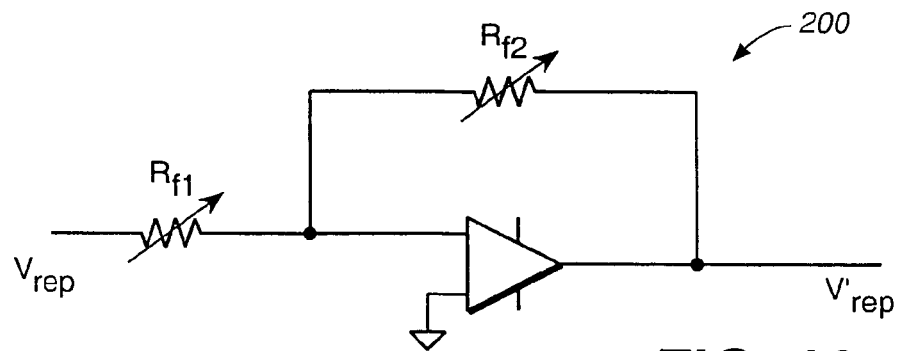
FIG. 10 is a schematic a diagram of an example of a voltage multiplier circuit.

FIG. 8 illustrates an example of a circuit to adjust or calibrate resistor R 52 to match output resistor R. As noted above one way to adjust the output of replication transmitter 30 to match the output NET 12 is to calibrate $R_{replication}$ 52 such that $R_{replication}$ 52 is substantial equal to R. This can be accomplished by providing an external resistor $R_{ext}$ which has the same value as the output resistor R. As shown in FIG. 8, the voltage developed across $R_{ext}$ is compared to $R_{replication}$ by comparator 65. $R_{replication}$ is adjusted until the voltages across $R_{ext}$ and $R_{replication}$ are substantially equal. FIG. 9 illustrates an example of an adjustable or variable resistance comprising n switchable resistances $R_{r1}$ through $R_m$ which are switched by respective switches $S_1$ through $S_n$, in response to comparator 65. The calibration or adjustment of $R_{replication}$ can be conducted upon startup, continuously, on a timed basis or upon a manual request.

FIG. 9 illustrates another arrangement in which the output voltage of replication transmitter is adjusted by voltage multiplier 200. As is known by one of ordinary skill in the art, $V'_{rep} = V_{rep} * R_{F2}/R_{F1}$. In this arrangement, the output of comparator 65 is used to adjust or calibrate either one or both of $R_{F2}$ and $R_{F1}$. $R_{F2}$ and $R_{F1}$ can be implemented, for example, as shown in FIG. 9.

Figure 12:
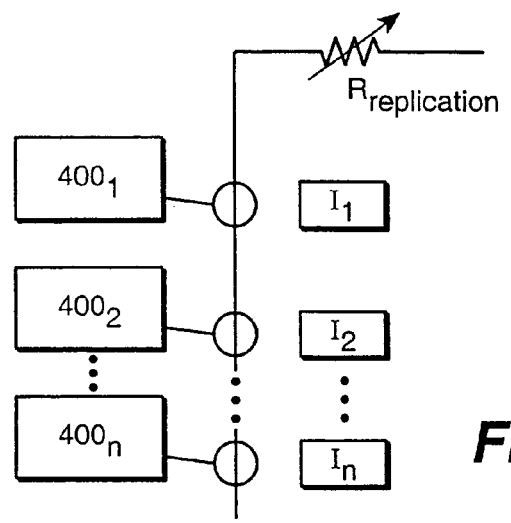
FIG. 12 is a diagram of another example of an adjustable transmitter.
Figure 13:
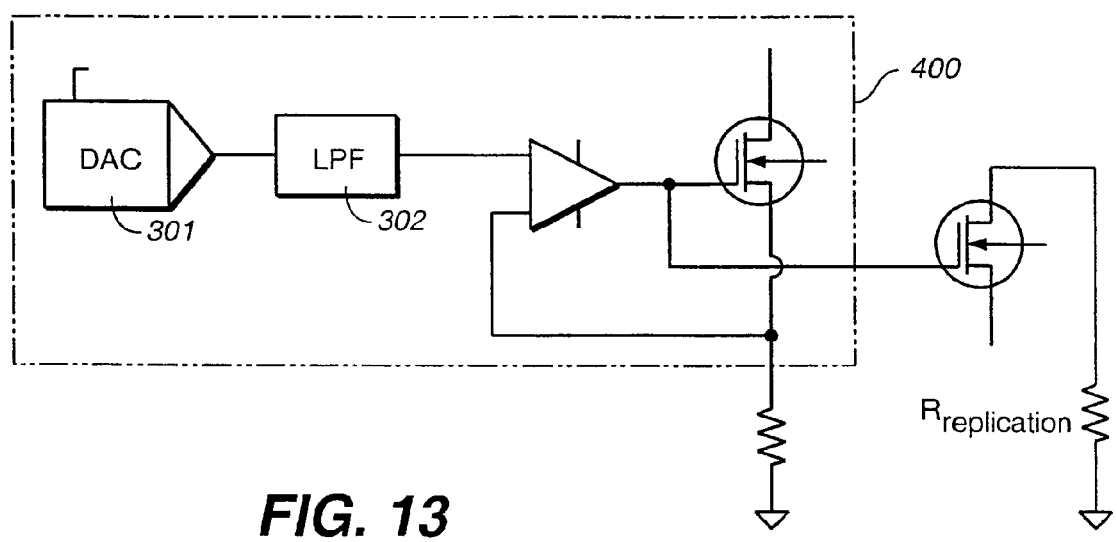
FIG. 13 is a schematic diagram of one of the power digital to analog converters of FIG. 12.

FIG. 12 is another implementation of replication transmitter 30. FIG. 12 illustrates a transmitter comprising n direct drive programmable high speed power digital-to-analog converters $400_1$–$400_n$. A complete description of such is provided in commonly assigned, copending application "Direct Drive Programmable High Speed Power Digital-to-Analog Converter," filed Dec. 18, 2000, and assigned U.S. application Ser. No. 09/737,474 (now U.S. Pat. No. 6,462,688), the contents of which are incorporated by reference herein. In accordance with I.E.E.E. standard 802.3ab, the transmitter provides 17 different levels which is accomplished by superpositioning selected ones of the direct drive programmable high speed power digital to analog converters $400_1$–$400_n$. In this arrangement, the replication transmitter comprises current sources $I_1 \ldots I_n$ configured in series to develop an output voltage across $R_{replication}$. In this arrangement, $R_{replication}$ may be adjustable similarly as described above. Alternatively, $R_{replication}$ may be fixed and the output voltage may be multiplied by a voltage multiplier similar to that of voltage multiplier 200. FIG. 13 shows the details of one of the direct drive programmable high speed power digital-to-analog converters $400_1$ and a detailed explanation of which can be found in the aforementioned commonly-assigned application.

Figure 14:
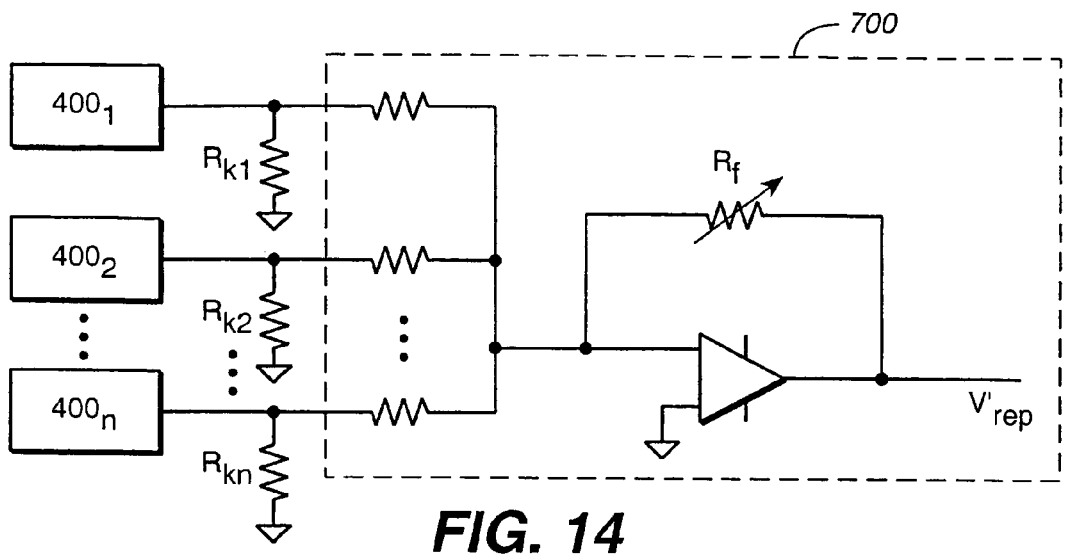
FIG. 14 is a diagram of a further example of an adjustable transmitter.
Figure 15:
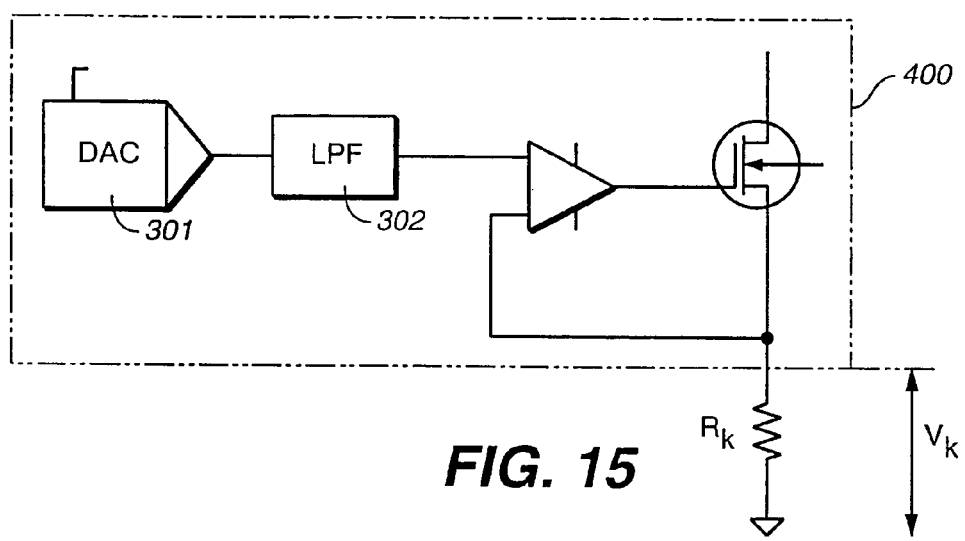
FIG. 15 is a schematic diagram of one of the power digital to analog converters of FIG. 14.
Figure 16:
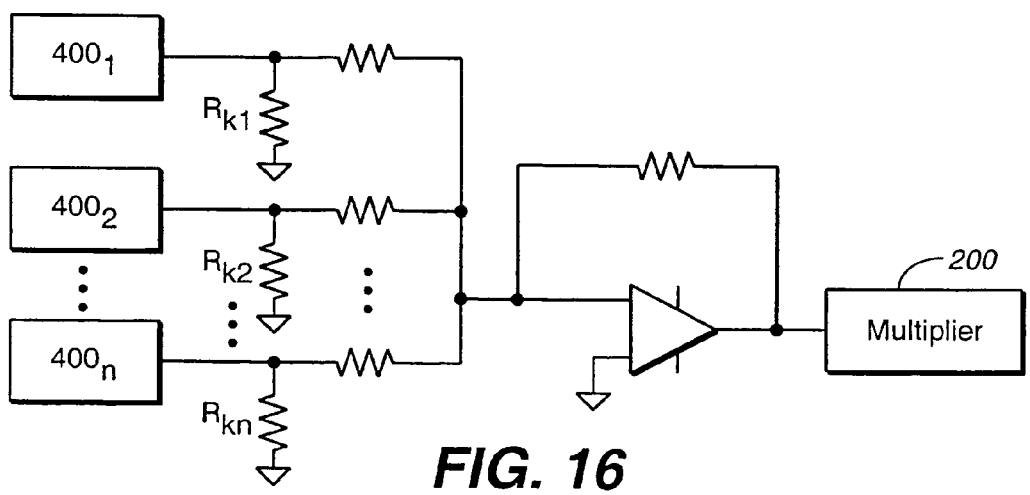
FIG. 16 is a diagram of an additional example of an adjustable transmitter.

FIGS. 14 and 15 show another embodiment which is a simplification to that in FIGS. 11 and 12. The inventor has observed that a replication voltage for each DAC is developed across each resistor $R_k$. Accordingly, the voltages developed can be summed by summing circuit 700. It is noted that resistor $R_f$ is adjustable as in the previous embodiments. FIG. 16 illustrates a variant to FIG. 15, where instead of calibrating feedback resistor $R_k$, the output voltage is multiplied by multiplier 200 as described above.

As a further variation to the preceding embodiments, it is proposed to provide an adjustable capacitive loading in the replica signal path to maximize the signal delay matching between the main signal path and the replica signal path. The main signal path does not see any changes as a result of adjusting replication transmitter 30, since replication transmitter 30 is not connected to the main signal path.

Adjustable replication transmitter may include an adaptive circuit for adjusting the capacitive loading to maximize the signal delay matching between the main signal path and the replica signal path.

While the invention has been particularly shown and described with reference to the preferred embodiments thereof, it will be understood by those skilled in the art that various changes in form and details may be made without departing from the spirit and scope of the invention. It is well within the scope of one of ordinary skill in the art to implement any of the functional circuits described herein. More specifically while the hybrid of the present embodiment is illustrated as an isolation transformer; one skilled in the art would appreciate an active circuit being substituted for the isolation transformer.

What is claimed is:

1. A communication circuit comprising:
   a near end transmitter;
   a hybrid having an input in communication with an output of the near end transmitter;
   a near end adjustable load replication transmitter having an adjustable load;
   a subtractor configured to subtract an output from the near end adjustable load replication transmitter from the output from the near end transmitter and the hybrid;
   a near end receiver responsive to an output of the subtractor; and
   a calibration circuit configured to adjust the adjustable load against a reference load.

2. The communication circuit of claim 1, wherein the near end adjustable load replication transmitter comprises a current generator in communication with the adjustable load.

3. The communication circuit of claim 1, wherein the near end adjustable load replication transmitter comprises an adjustable current generator in communication with a load.

4. The communication circuit of claim 1, wherein the near end adjustable load replication transmitter is configured to maximize amplitude matching between the near end transmitter and the near end adjustable replication transmitter.

5. The communication circuit of claim 1, wherein the near end adjustable load replication transmitter comprises a voltage multiplier.

6. The communication circuit of claim 1, comprising:
   an adjustable capacitive load in communication with the near end adjustable load replication transmitter and configured to maximize signal delay matching between the near end transmitter and the near end adjustable load replication transmitter.

7. A communication circuit comprising:
   a near end transmitter;
   a hybrid having an input in communication with an output of the near end transmitter;
   a near end adjustable load replication transmitter having an adjustable load;
   a subtractor configured to subtract an output from the near end adjustable load replication transmitter from the output from the near end transmitter and the hybrid;
   a near end receiver responsive to an output of the subtractor; and
   an adjustable capacitive load in communication with the near end adjustable load replication transmitter, wherein the adjustable capacitive load adjusts signal delays of transmitted and replication signals generated by the near end transmitter and the near end adjustable load replication transmitter, respectively.

8. The communication circuit of claim 7, comprising:
   an adaptive control circuit,
      wherein the adjustable capacitive load is responsive to the adaptive control circuit.

9. A communication method, comprising the steps of:
   (a) transmitting a transmitted signal;
   (b) combining the transmitted signal with a received signal from a channel;
   (c) generating a replication signal using a near end adjustable load replication transmitter having an adjustable load that is adjusted against a reference load;
   (d) adjusting the replication signal;
   (e) subtracting the adjusted replication signal from the transmitted and received signals to generate an output signal; and
   (f) receiving the output signal from step (e).

10. The communication method of claim 9, wherein step (d) comprises the steps of:
    (d1) adjusting a current; and
    (d2) adjusting the adjustable load.

11. The communication method of claim 9, wherein step (d) comprises the step of:
    (d1) adjusting a current.

12. The communication method of claim 9, wherein step (d) comprises the step of:
    (d1) maximizing amplitude matching between the replication signal and the transmitted signal.

13. A communication circuit, comprising:
    a near end circuit comprising:
       a near end transmitter;
       a near end hybrid having a first terminal in communication with an output of the near end transmitter and a second terminal;
       a near end adjustable load replication transmitter having an adjustable load;
       a near end subtractor configured to subtract an output from the near end adjustable load replication transmitter from the output from the near end transmitter and the near end hybrid; and
       a near end receiver responsive to an output of the near end subtractor; and
    a calibration circuit configured to adjust the adjustable load against a reference load; and
    a far end circuit comprising:
       a far end transmitter;
       a far end hybrid having a third terminal in communication with an output of the far end transmitter and a fourth terminal in communication with the second terminal of the near end hybrid;
       a far end adjustable load replication transmitter having an adjustable load;
       a far end subtractor configured to subtract an output from the far end adjustable load replication transmitter from the output from the far end transmitter and the far end hybrid; and
       a far end receiver responsive to an output of the far end subtractor; and
    a calibration circuit configured to adjust the adjustable load against a reference load.

14. A communication method, comprising the steps of:
    (a) transmitting a first signal;
    (b) combining the first signal with a second signal from a channel;
    (c) generating a first replication signal using a first near end adjustable load replication transmitter having an adjustable load that is adjusted against a reference load;
    (d) adjusting the first replication signal;
    (e) subtracting the adjusted first replication signal from the first and second signals to generate a first output signal;
    (f) receiving the first output signal from step (e);
    (g) transmitting the second signal;
    (h) combining the second signal with the first signal from the channel;
    (i) generating a second replication signal using a second near end adjustable load replication transmitter having an adjustable load that is adjusted against a reference load;
    (j) adjusting the second replication signal;
    (k) subtracting the adjusted second replication signal from the first and second signals to generate a second output signal; and
    (l) receiving the second output signal from step (k).

15. A communication circuit, comprising:
a near end transmitter comprising at least one near end current source; and
a near end replication transmitter comprising:
at least one replication current source arranged in series and configured to generate a replication voltage across a replication resistance,
wherein the at least one replication current source corresponds to a respective one of the at least one near end current source, and
wherein the at least one replication current source is in electrical communication with a respective one of the at least one near end current source; and
wherein each of the at least one near end current source comprises:
a near end transistor, and
wherein each of the at least one replication current source comprises:
a replication current transistor,
wherein a gate of a corresponding near end transistor is coupled directly to a gate of a respective near end replication transistor.

16. The communication circuit of claim 15, wherein the replication voltage is scaled in accordance with a size of the replication resistance and a size of the at least one replication current transistor.

17. The communication circuit of claim 15, comprising:
a hybrid having an input in communication with an output of the near end transmitter;
a subtractor configured to subtract an output from the near end replication transmitter from the output from the near end transmitter and an output of the hybrid; and
a near end receiver responsive to an output of the subtractor.

18. The communication circuit of claim 17, wherein the hybrid comprises:
an output resistance; and
a transformer.

19. An Ethernet transceiver, comprising:
a near end transmitter comprising at least one near end current source; and
a near end replication transmitter comprising:
at least one replication current source arranged in series and configured to generate a replication voltage across a replication resistance,
wherein the at least one replication current source corresponds to a respective one of the at least one near end current source, and
wherein the at least one replication current source is in electrical communication with a respective one of the at least one near end current source; and
wherein each of the at least one near end current source comprises:
a near end transistor, and
wherein each of the at least one replication current source comprises:
a replication current transistor,
wherein a gate of a corresponding near end transistor is coupled directly to a gate of a respective near end replication transistor.

20. The Ethernet transceiver of claim 19, wherein the replication voltage is scaled in accordance with a size of the replication resistance and a size of the at least one replication current transistor.

21. The Ethernet transceiver of claim 19, comprising:
a hybrid having an input in communication with an output of the near end transmitter;
a subtractor configured to subtract an output from the near end replication transmitter from the output from the near end transmitter and an output of the hybrid; and
a near end receiver responsive to an output of the subtractor.

22. The Ethernet transceiver of claim 21, wherein the hybrid comprises:
an output resistance; and
a transformer.

23. The Ethernet transceiver of claim 21, wherein the Ethernet transceiver is compliant with I.E.E.E. 802.3ab.

24. A transceiving method, comprising the steps of:
(a) generating a near end signal for transmission via a transceiver by:
(a1) generating a plurality of near end currents; and
(a2) summing the generated plurality of near end currents generated in step (a1); and
(b) generating a replication signal by:
(b1) generating a plurality of replication currents based on the generated plurality of near end currents generated in step (a1); and
(b2) summing the generated plurality of replication currents generated in step (b1).

25. The transceiving method of claim 24, wherein step (b) comprises the step of:
(b3) converting the summed replication currents summed in step (b2) to a voltage.

26. The transceiving method of claim 24, comprising the steps of:
(c) combining a received signal with the near end signal generated in step (a);
(d) subtracting the replication signal in step (b) from the combined signal in step (c) to generate an output; and
(e) receiving the output from step (d).

27. The communication circuit of claim 1, wherein the subtractor receives a transmitted signal generated by the near end transmitter directly from the output of the near end transmitter.

28. The communication circuit of claim 1, wherein the near end adjustable load replication transmitter replicates an amplitude of a transmitted signal generated by the near end transmitter.

29. The communication method of claim 9, wherein step (d) comprises the step of:
(d1) replicating an amplitude of the transmitted signal.

30. A communication method comprising:
(a) transmitting a transmitted signal;
(b) combining the transmitted signal with a received signal from a channel;
(c) generating a replication signal using a near end adjustable load replication transmitter having an adjustable load;
(d) adjusting the replication signal;
(e) subtracting the adjusted replication signal from the transmitted and received signals to generate an output signal; and
(f) receiving the output signal from step (e);
wherein step (d) comprises the step of:
(d1) adjusting signal delays of the transmitted signal and the replication signal.

* * * * *